(12) United States Patent
Hidaka et al.

(10) Patent No.: US 10,026,368 B2
(45) Date of Patent: Jul. 17, 2018

(54) DISPLAY DEVICE AND ELECTRONIC APPARATUS

(71) Applicant: SONY CORPORATION, Tokyo (JP)

(72) Inventors: Yukinori Hidaka, Saitama (JP); Ken Ootsuka, Chiba (JP); Naoto Kinoshita, Chiba (JP)

(73) Assignee: SONY CORPORATION, Tokyo (JP)

( * ) Notice: Subject to any disclaimer, the term of this patent is extended or adjusted under 35 U.S.C. 154(b) by 7 days.

(21) Appl. No.: 15/022,031

(22) PCT Filed: Sep. 2, 2014

(86) PCT No.: PCT/JP2014/073015
§ 371 (c)(1),
(2) Date: Mar. 15, 2016

(87) PCT Pub. No.: WO2015/045752
PCT Pub. Date: Apr. 2, 2015

(65) Prior Publication Data
US 2016/0232856 A1    Aug. 11, 2016

(30) Foreign Application Priority Data

Sep. 25, 2013    (JP) .................................. 2013-197791

(51) Int. Cl.
*G09G 5/00* (2006.01)
*G09G 3/34* (2006.01)
(Continued)

(52) U.S. Cl.
CPC ......... *G09G 3/3426* (2013.01); *G06F 1/1641* (2013.01); *G06F 1/1647* (2013.01);
(Continued)

(58) Field of Classification Search
CPC ...... G09G 3/3426; G09G 3/20; G09G 3/3258; G09G 3/3413; G09G 3/3696; G09G 3/36;
(Continued)

(56) References Cited

U.S. PATENT DOCUMENTS

2006/0072047 A1    4/2006  Sekiguchi
2008/0303982 A1    12/2008 Jin et al.
(Continued)

FOREIGN PATENT DOCUMENTS

JP    2001-022303    1/2001
JP    2004-045769    2/2004
(Continued)

OTHER PUBLICATIONS

Extended European Search Report of EP Patent Application No. 14847445.5, dated Mar. 24, 2017, 10 pages.
(Continued)

*Primary Examiner* — Mark Regn
(74) *Attorney, Agent, or Firm* — Chip Law Group

(57) ABSTRACT

A display device includes a display section (11) having a first display surface and a second display surface (S1, S2) facing each other. The display section (11) includes a first display panel (111) disposed on the first display surface (S1) side, and including a plurality of light emitting elements, and a second display panel (112) disposed on the second display surface (S2) side, and including a plurality of light control elements each performing light control for control of transmission or reflection of incident light performing reflective image display utilizing the reflection of the incident light.

6 Claims, 27 Drawing Sheets

(51) Int. Cl.

| | | |
|---|---|---|
| *G09G 3/20* | (2006.01) | |
| *G06F 3/147* | (2006.01) | |
| *G06F 1/16* | (2006.01) | |
| *G09G 3/3258* | (2016.01) | |
| *G09G 5/10* | (2006.01) | |
| *G09G 5/14* | (2006.01) | |
| *G09G 3/36* | (2006.01) | |
| *H01L 27/32* | (2006.01) | |
| *G02F 1/1333* | (2006.01) | |

(52) U.S. Cl.
CPC .......... *G06F 1/1652* (2013.01); *G06F 1/1677* (2013.01); *G06F 1/1694* (2013.01); *G06F 3/147* (2013.01); *G09G 3/20* (2013.01); *G09G 3/3258* (2013.01); *G09G 3/3413* (2013.01); *G09G 3/3696* (2013.01); *G09G 5/10* (2013.01); *G09G 5/14* (2013.01); *G02F 2001/133342* (2013.01); *G09G 3/36* (2013.01); *G09G 2300/023* (2013.01); *G09G 2300/0456* (2013.01); *G09G 2300/0469* (2013.01); *G09G 2320/0613* (2013.01); *G09G 2320/0626* (2013.01); *G09G 2320/0666* (2013.01); *G09G 2320/0686* (2013.01); *G09G 2330/021* (2013.01); *G09G 2360/144* (2013.01); *G09G 2380/02* (2013.01); *H01L 27/3232* (2013.01); *H01L 2251/5323* (2013.01)

(58) Field of Classification Search
CPC ..... G09G 2300/023; G09G 2300/0456; G09G 2300/0469; G09G 2320/0626; G09G 2320/0666; G09G 2320/0686; G09G 2330/021; G09G 2360/144; G09G 2380/02; G06F 1/1641; G06F 1/1647; G06F 1/1652; G06F 1/1677; G06F 1/1694; G06F 3/147; G02F 2001/133342; H01L 27/3232; H01L 2251/5323
USPC .......................................................... 345/207
See application file for complete search history.

(56) References Cited

U.S. PATENT DOCUMENTS

| | | | | |
|---|---|---|---|---|
| 2011/0292095 | A1* | 12/2011 | Yoshida | ............... G02F 1/13624 345/690 |
| 2012/0049723 | A1* | 3/2012 | Lee | ....................... H01L 25/048 313/498 |
| 2012/0268696 | A1* | 10/2012 | Yim | ......................... G09G 3/32 349/104 |

FOREIGN PATENT DOCUMENTS

| | | |
|---|---|---|
| JP | 2004-302321 | 10/2004 |
| JP | 2007-140513 | 6/2007 |
| JP | 2010-224403 | 10/2010 |
| JP | 2011-053672 | 3/2011 |
| JP | 2013-058406 | 3/2013 |
| WO | 2004/053819 | 6/2004 |
| WO | 2010/090008 | 8/2010 |

OTHER PUBLICATIONS

Office Action for CN Patent Application No. 201480051786.8, dated Apr. 20, 2018, 7 pages of Office Action and 7 pages of English Translation.

* cited by examiner

[ FIG. 1A ]
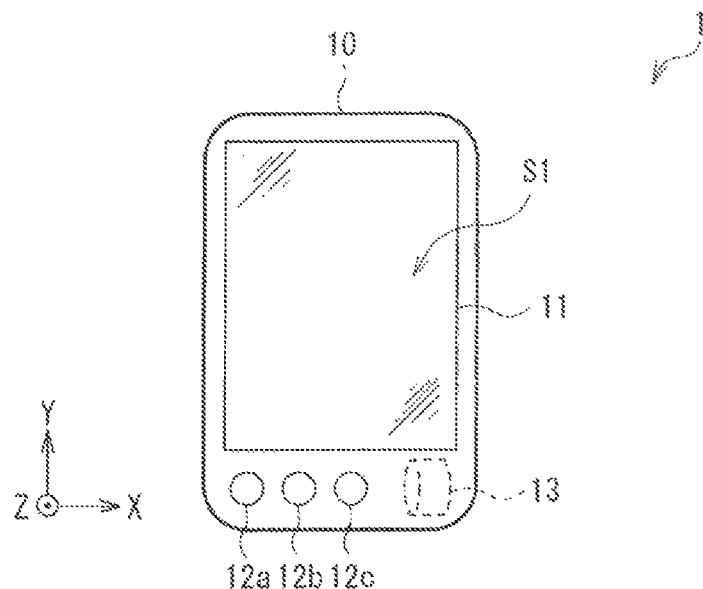
[ FIG. 1B ]
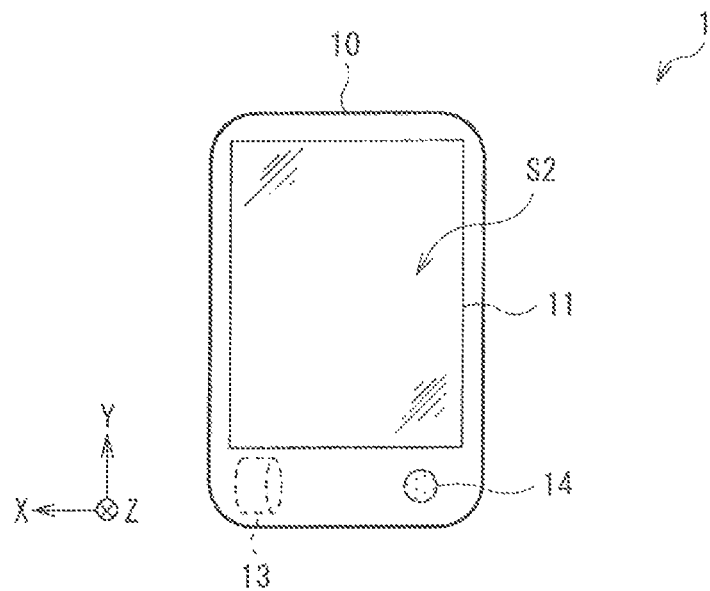

[FIG. 2]
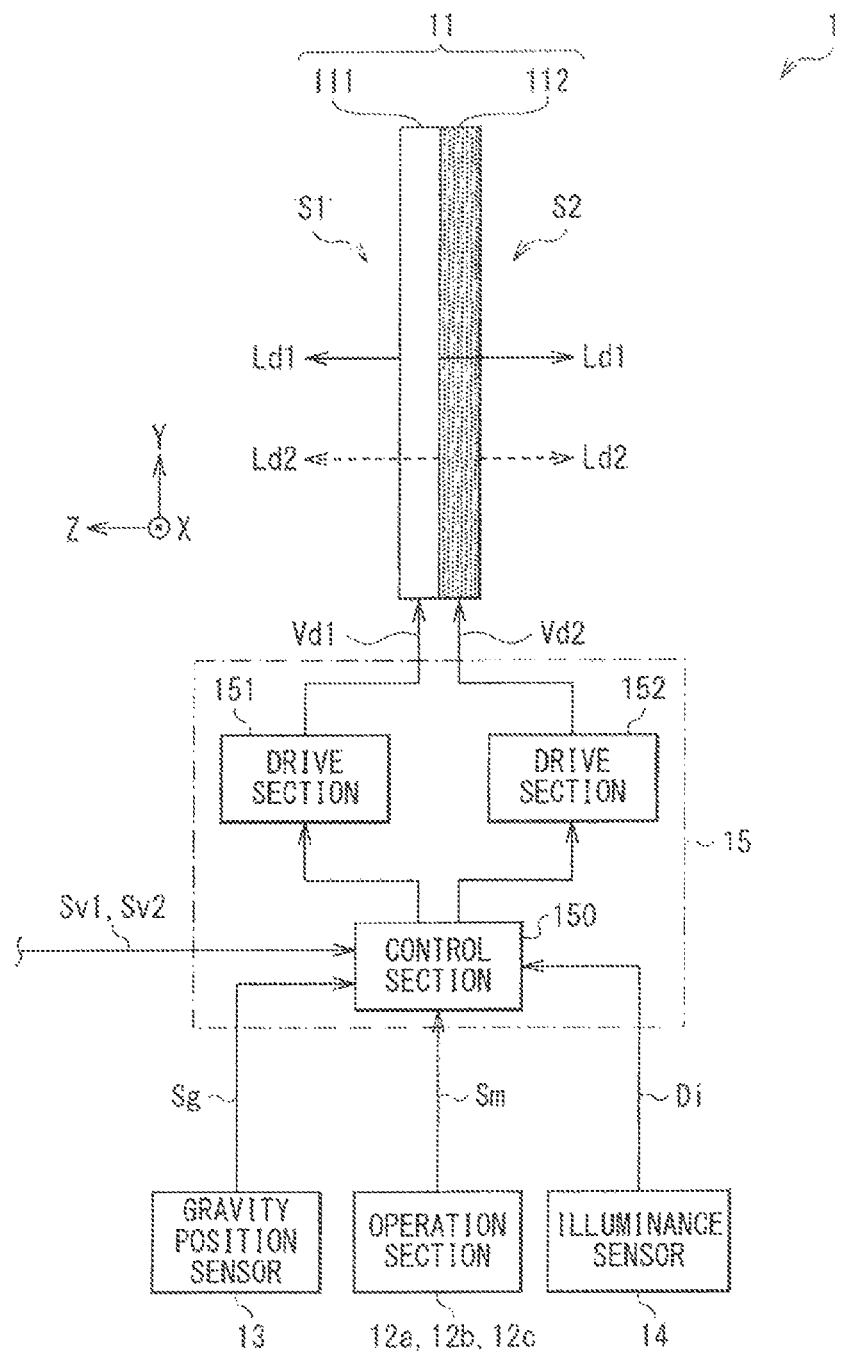

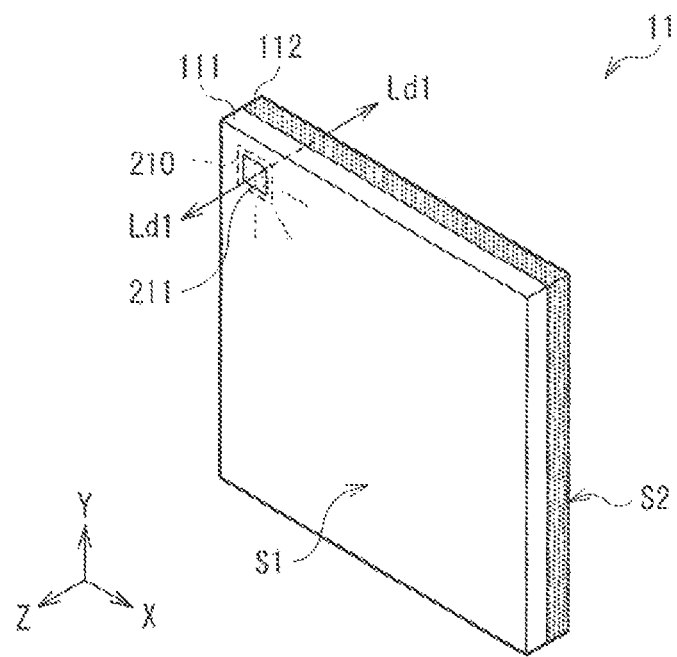
[FIG. 3A]
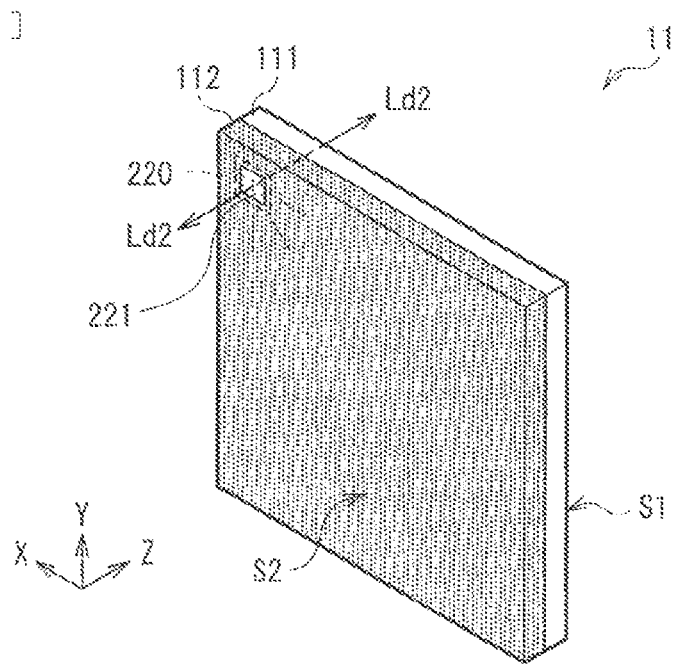
[FIG. 3B]

[FIG. 4]
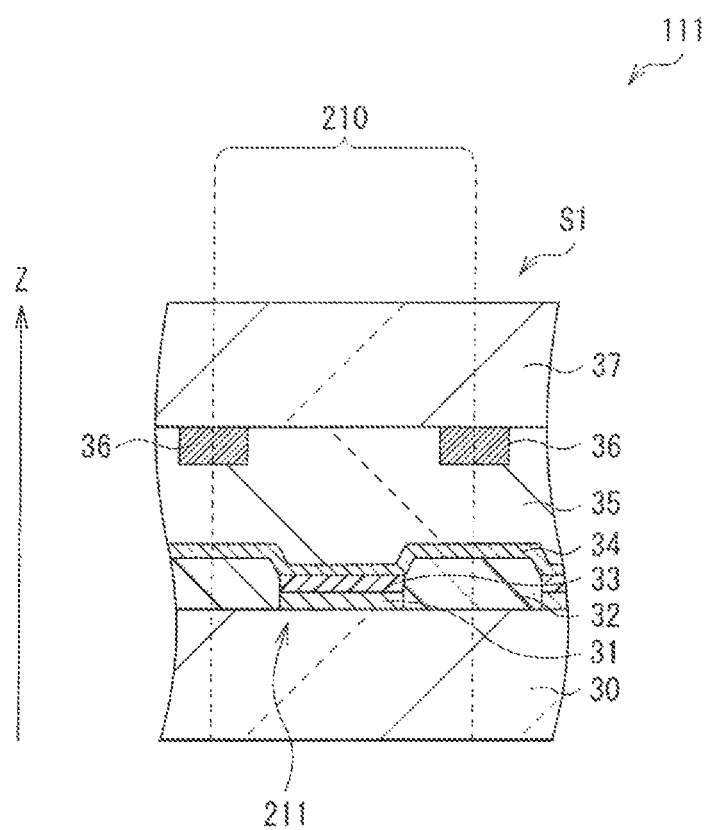

[ FIG. 5A ]
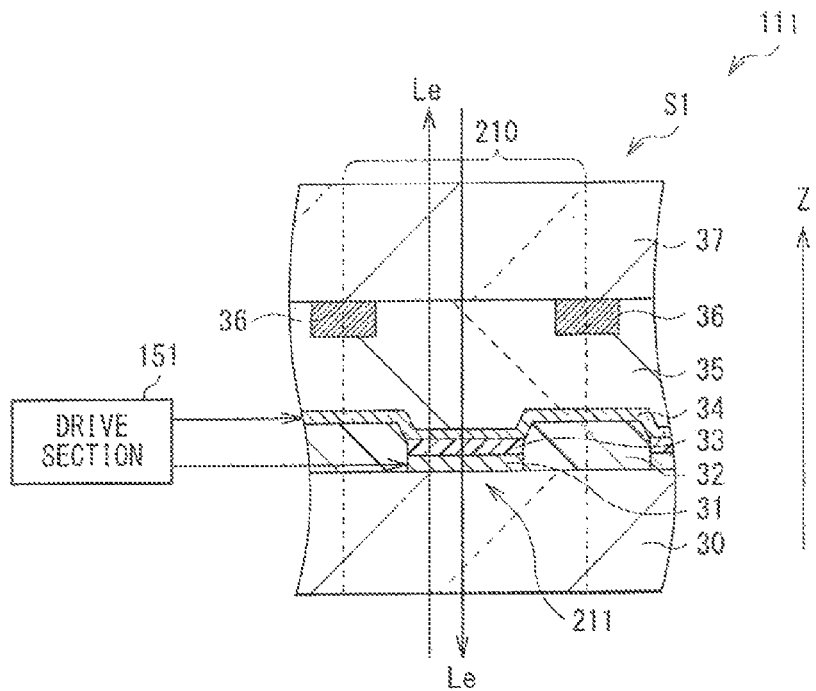
[ FIG. 5B ]
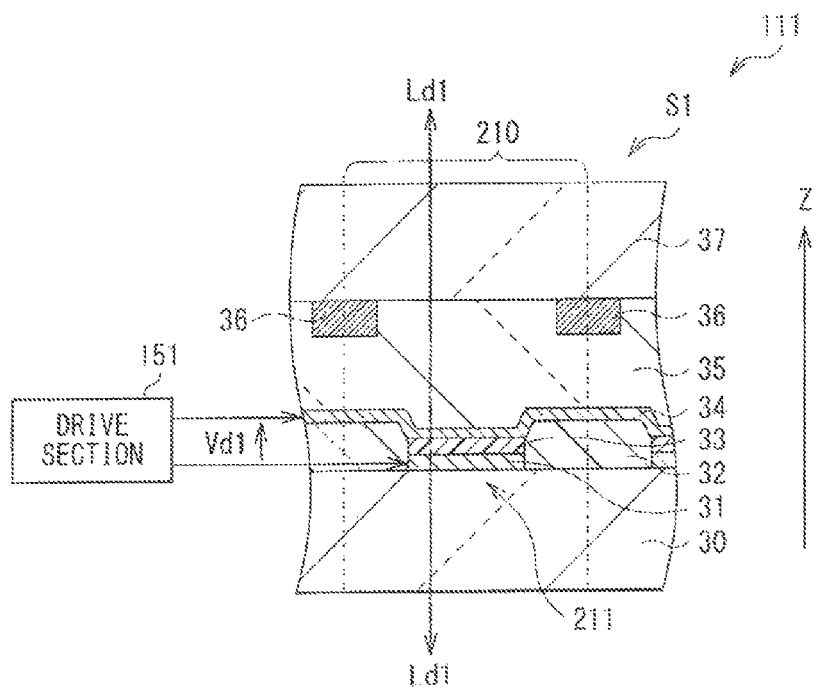

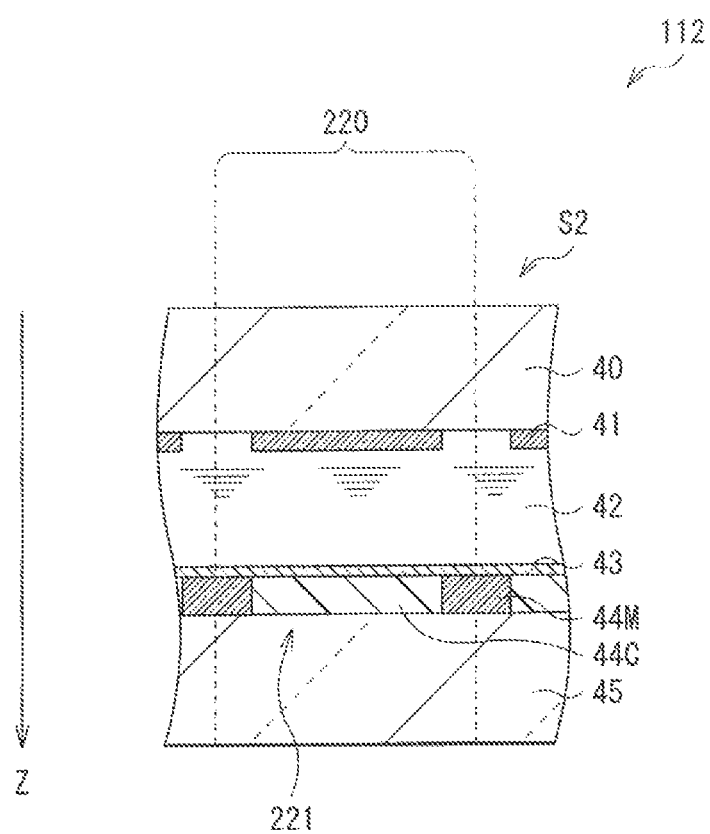
[FIG. 6]

[ FIG. 7A ]
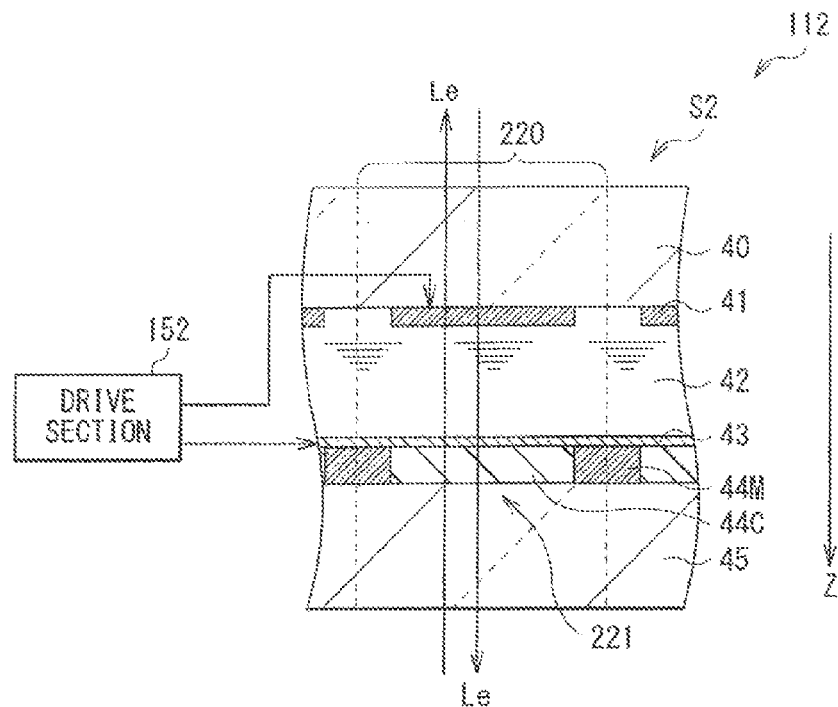
[ FIG. 7B ]
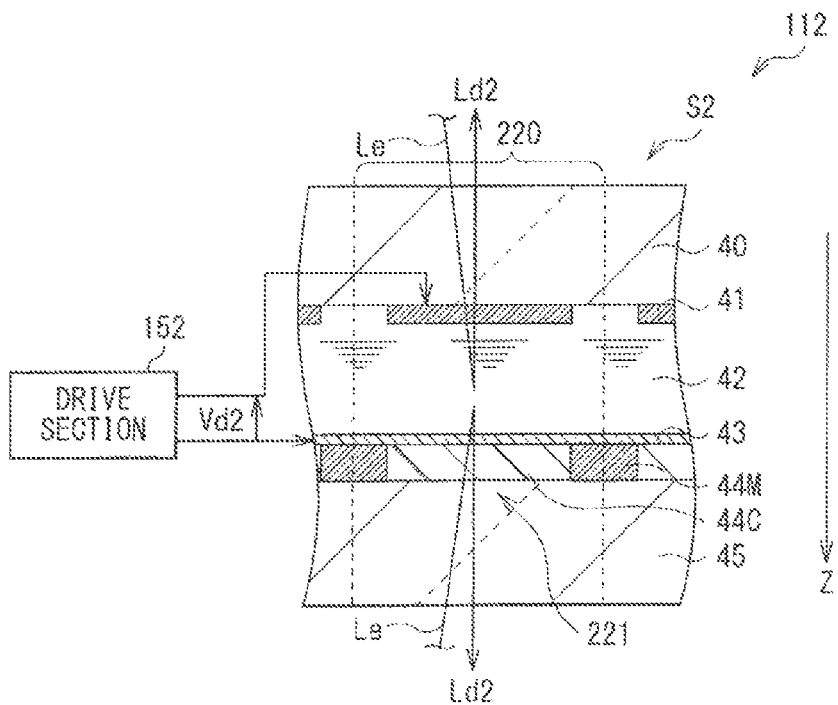

[ FIG. 8A ]
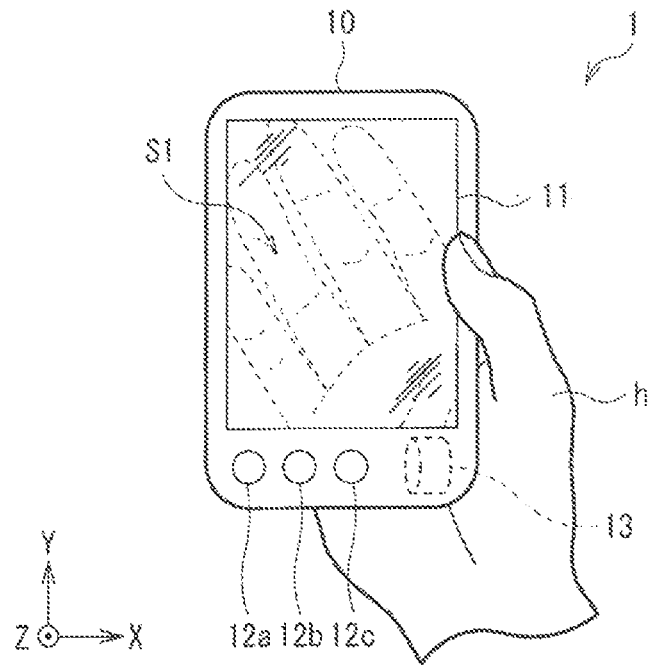
[ FIG. 8B ]
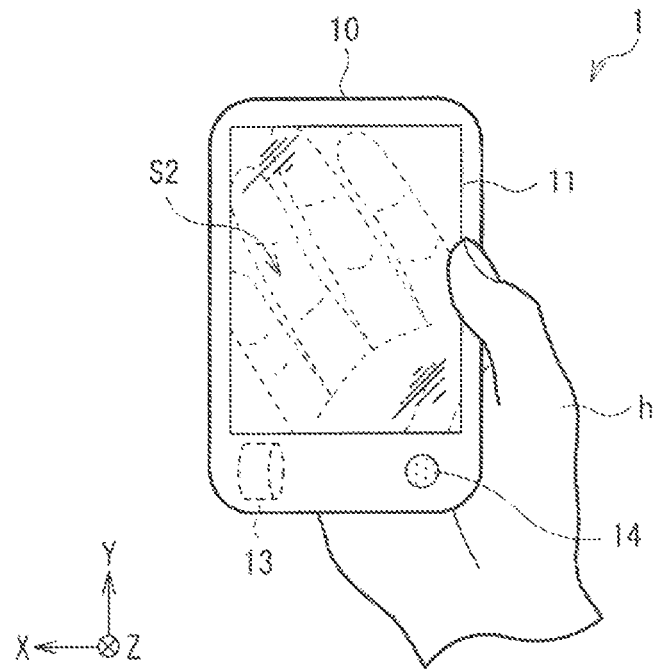

[ FIG. 9A ]
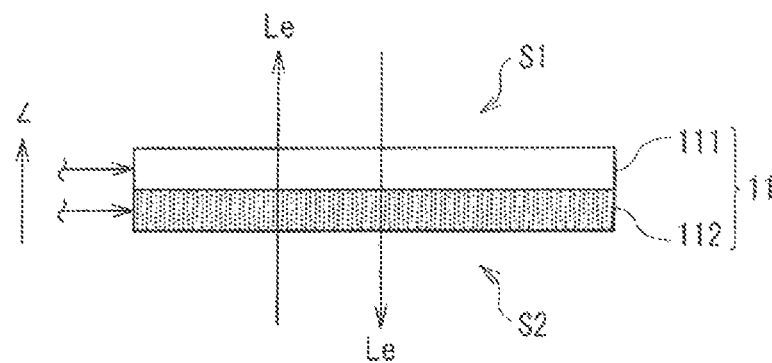
[ FIG. 9B ]
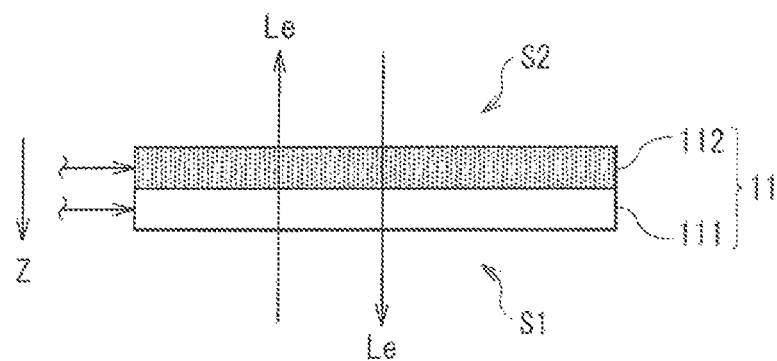

[ FIG. 10A ]
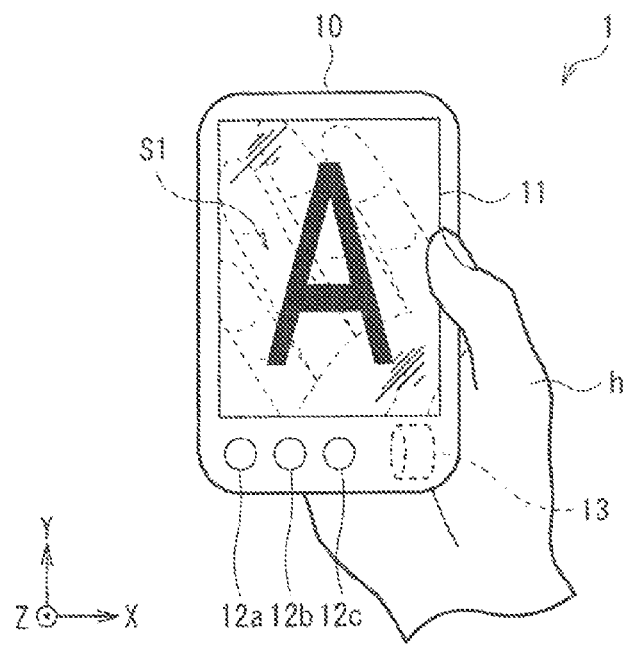
[ FIG. 10B ]
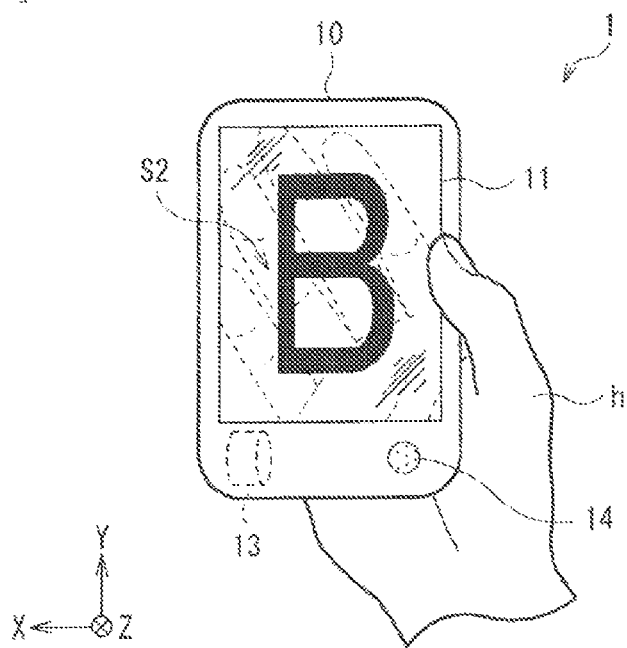

[ FIG. 11A ]
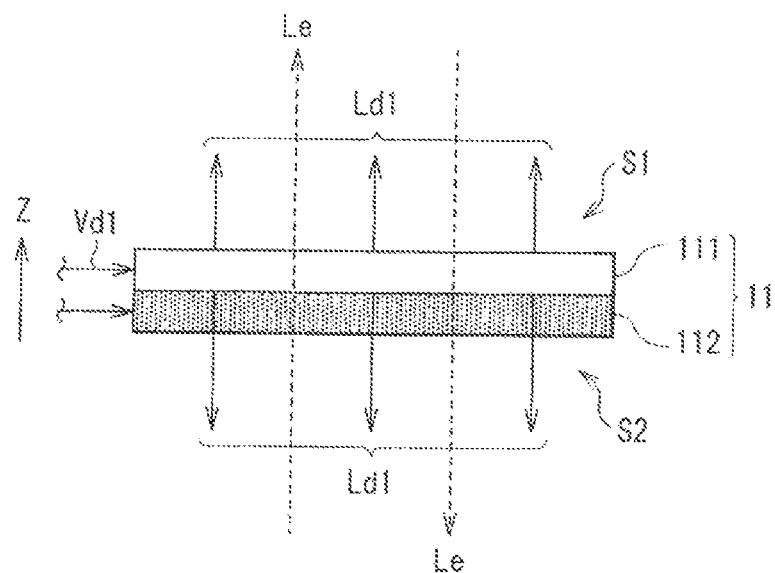
[ FIG. 11B ]
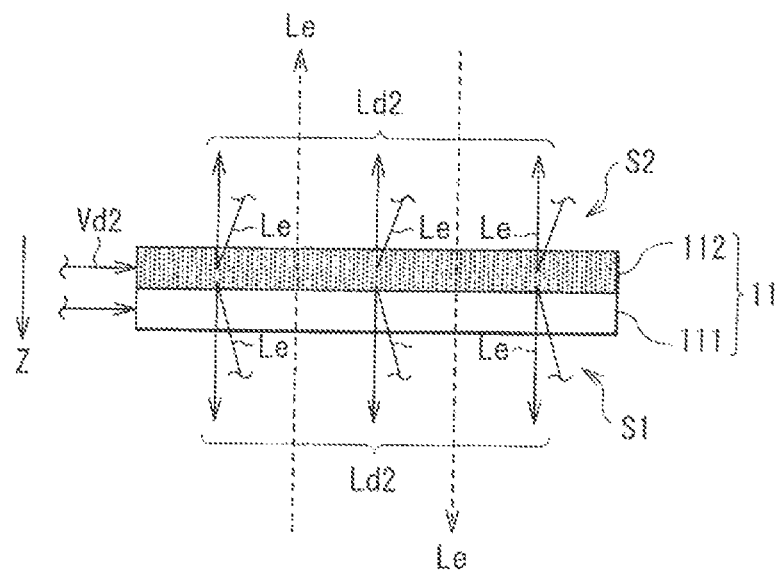

[ FIG. 12A ]
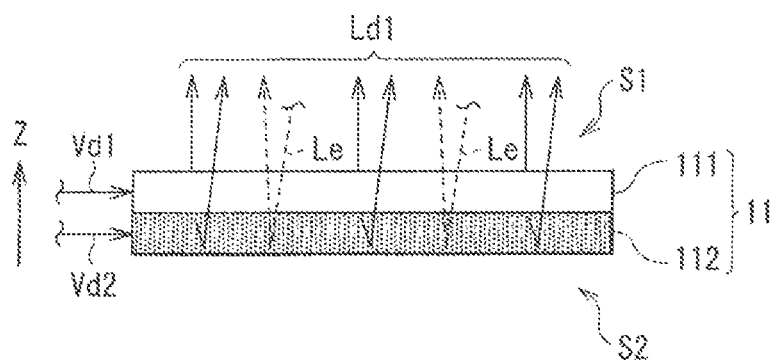
[ FIG. 12B ]
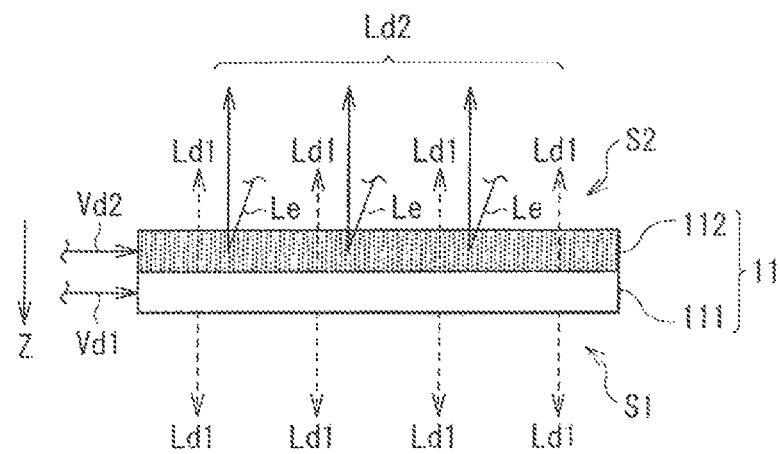

[ FIG. 13A ]
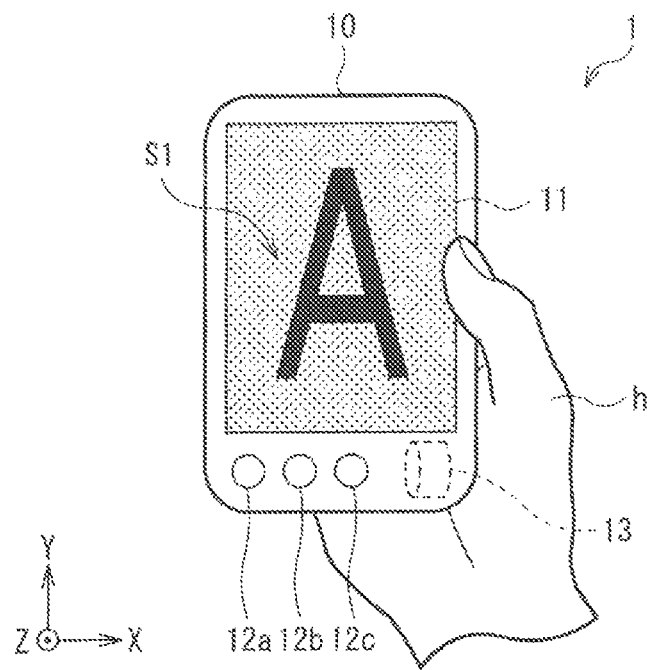
[ FIG. 13B ]
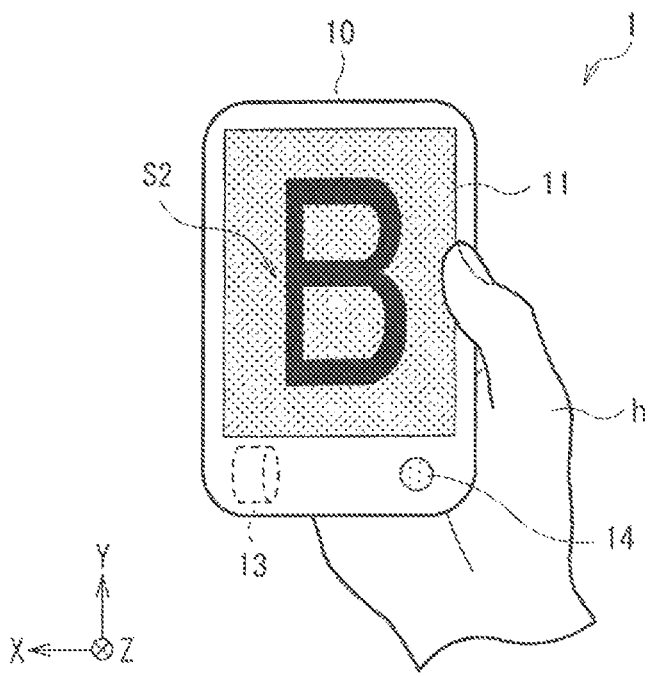

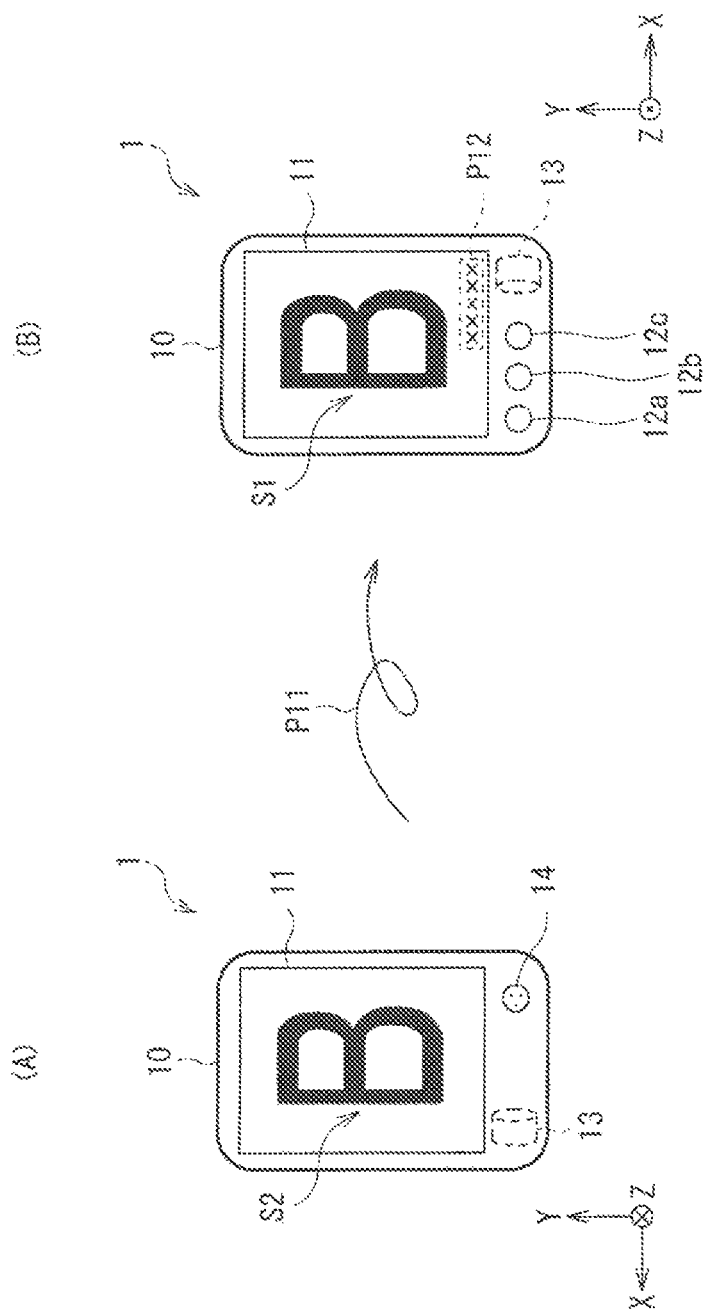
[FIG. 14]

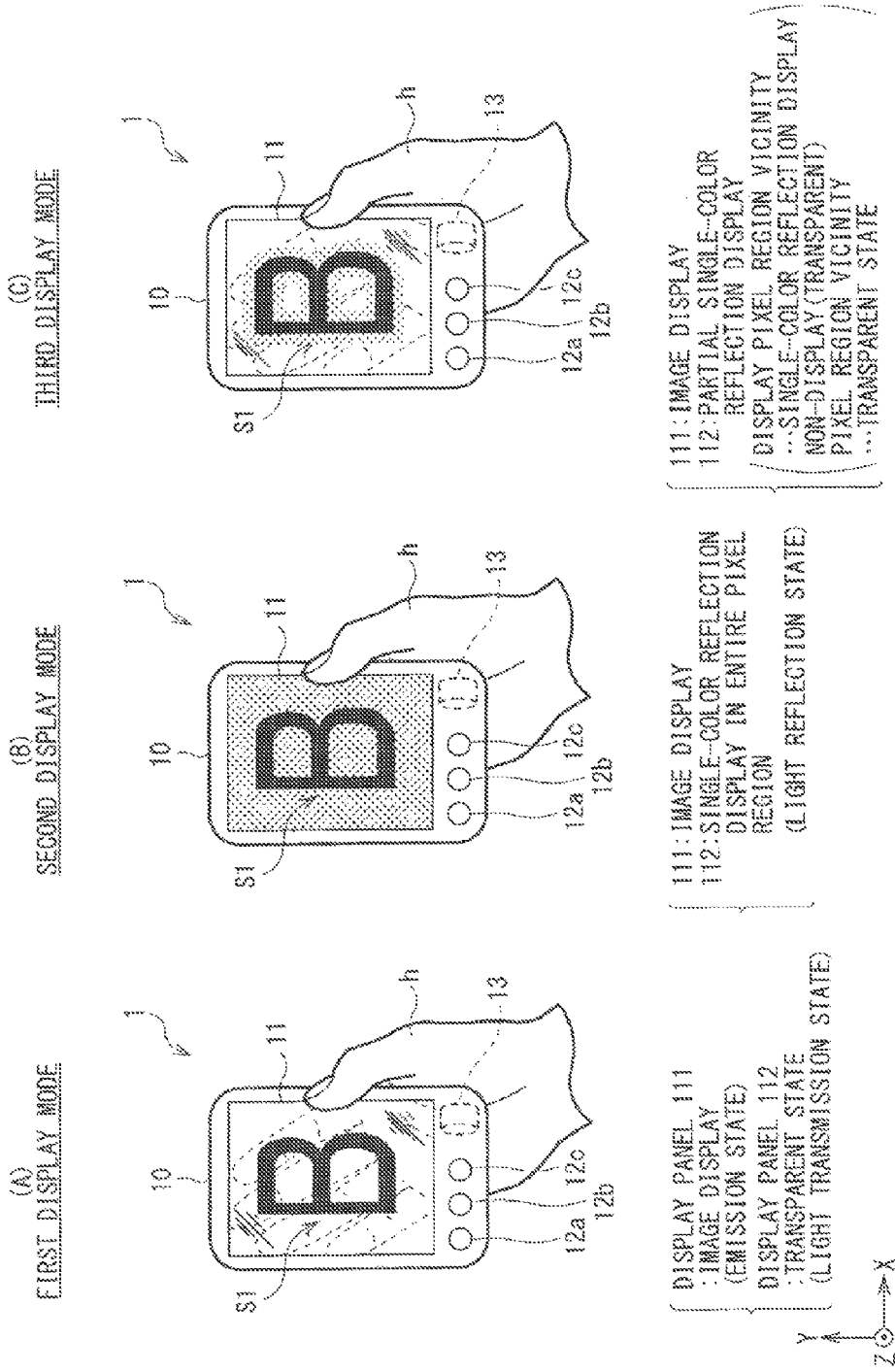

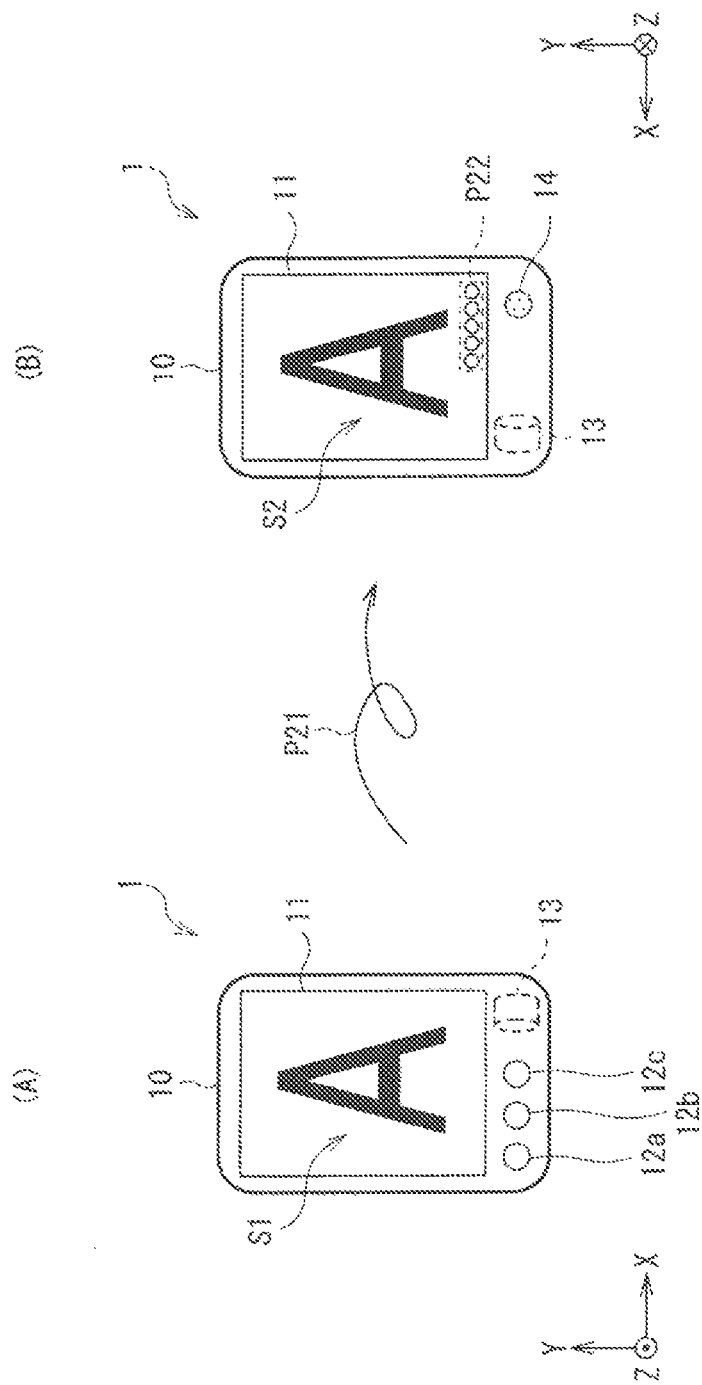

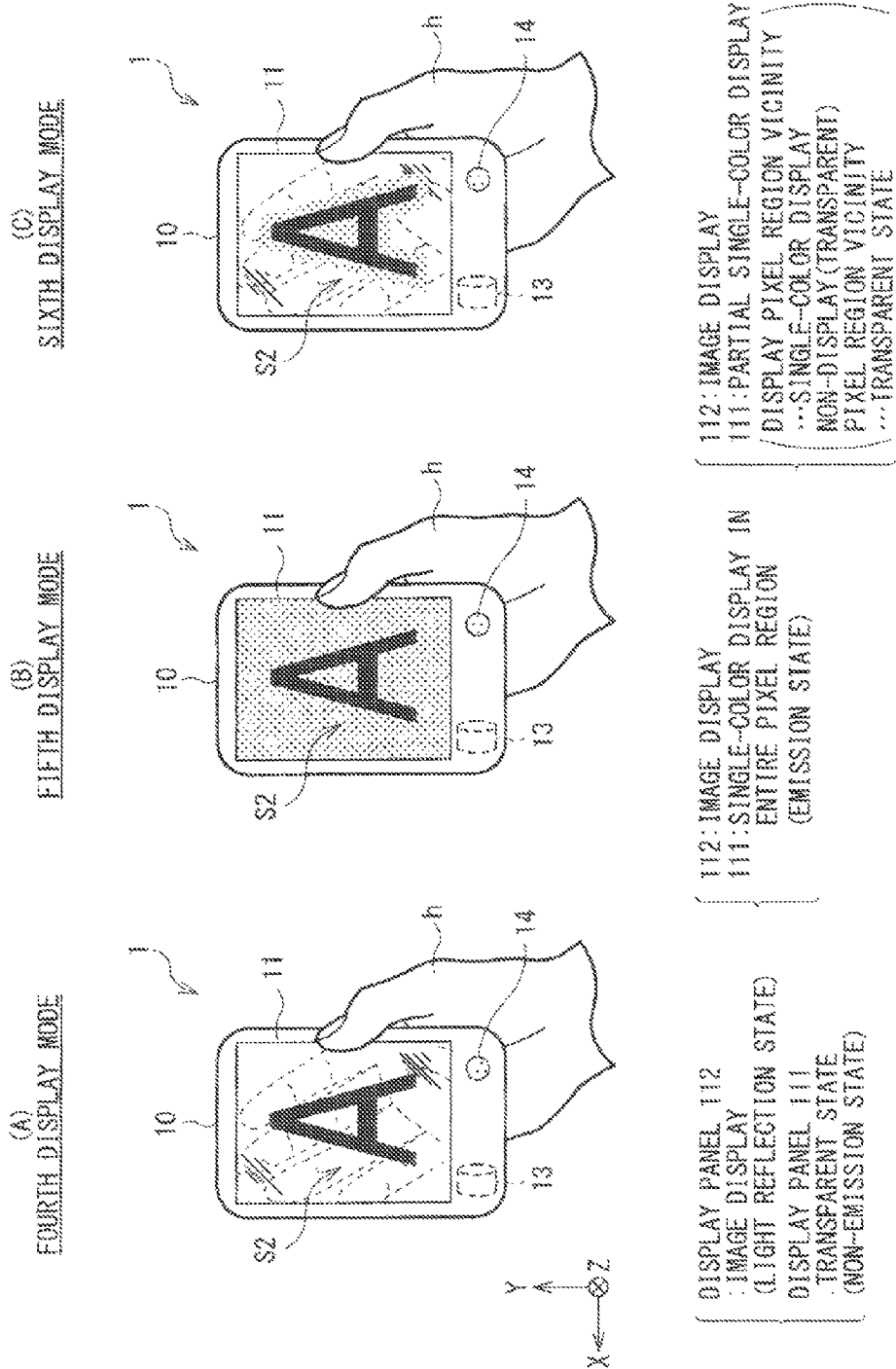

[ FIG. 18 ]

(A) ADAPTABILITY TO PRESENCE/ABSENCE OF EXTERNAL POWER SUPPLY ex. IN HOUSE (EXTERNAL POWER SUPPLY BEING PRESENT)

| VISUAL RECOGNITION ON DISPLAY SURFACE S1 (UPPER SIDE) | |
|---|---|
| SECOND DISPLAY MODE | THIRD DISPLAY MODE | ex. GARDEN (BATTERY DRIVING)

| VISUAL RECOGNITION ON DISPLAY SURFACE S2 (UPPER SIDE) | |
|---|---|
| FIFTH DISPLAY MODE | FIRST DISPLAY MODE | ex. ON TRAIN (BATTERY DRIVING)

| VISUAL RECOGNITION ON DISPLAY SURFACE S2 (UPPER SIDE) | |
|---|---|
| SIXTH DISPLAY MODE | FOURTH DISPLAY MODE |

(B) ADAPTABILITY TO LIGHT ENVIRONMENT

DARKNESS

| VISUAL RECOGNITION ON DISPLAY SURFACE S1 (UPPER SIDE) | |
|---|---|
| FIRST DISPLAY MODE | SECOND DISPLAY MODE | ex. ROOM DURING DAYTIME

| VISUAL RECOGNITION ON DISPLAY SURFACE S1 (UPPER SIDE) | |
|---|---|
| THIRD DISPLAY MODE | SIXTH DISPLAY MODE |

IN DIRECT SUNLIGHT

| VISUAL RECOGNITION ON DISPLAY SURFACE S2 (UPPER SIDE) | |
|---|---|
| FIFTH DISPLAY MODE | FOURTH DISPLAY MODE |

(C) FASHIONABILITY

ORTHODOX

| VISUAL RECOGNITION ON DISPLAY SURFACE S1 (UPPER SIDE) |
|---|
| FIRST DISPLAY MODE |

UNIQUENESS EMPHASIZING FASHION

| VISUAL RECOGNITION ON DISPLAY SURFACE S2 (UPPER SIDE) | |
|---|---|
| FOURTH DISPLAY MODE | THIRD DISPLAY MODE |

SPARKLING EFFECT

| VISUAL RECOGNITION ON DISPLAY SURFACE S1 (UPPER SIDE) |
|---|
|  |

(D) ADAPTABILITY ACCORDING TO TYPE OF IMAGE ex. PICTURE APPRECIATION

| VISUAL RECOGNITION ON DISPLAY SURFACE S2 (UPPER SIDE) | |
|---|---|
| FOURTH DISPLAY MODE | FIFTH DISPLAY MODE | ex. MOVIE

| VISUAL RECOGNITION ON DISPLAY SURFACE S1 (UPPER SIDE) | |
|---|---|
| THIRD DISPLAY MODE | SECOND DISPLAY MODE | ex. SPORTS MOVING IMAGE

| VISUAL RECOGNITION ON DISPLAY SURFACE S1 (UPPER SIDE) | |
|---|---|
| SIXTH DISPLAY MODE | FIRST DISPLAY MODE |

[ FIG. 19 ]
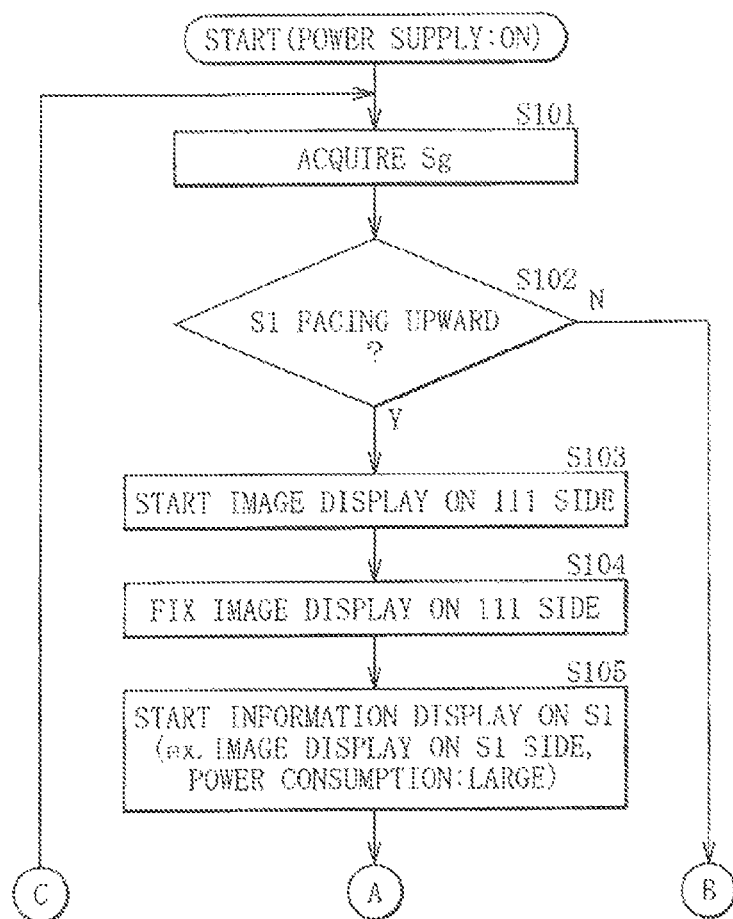

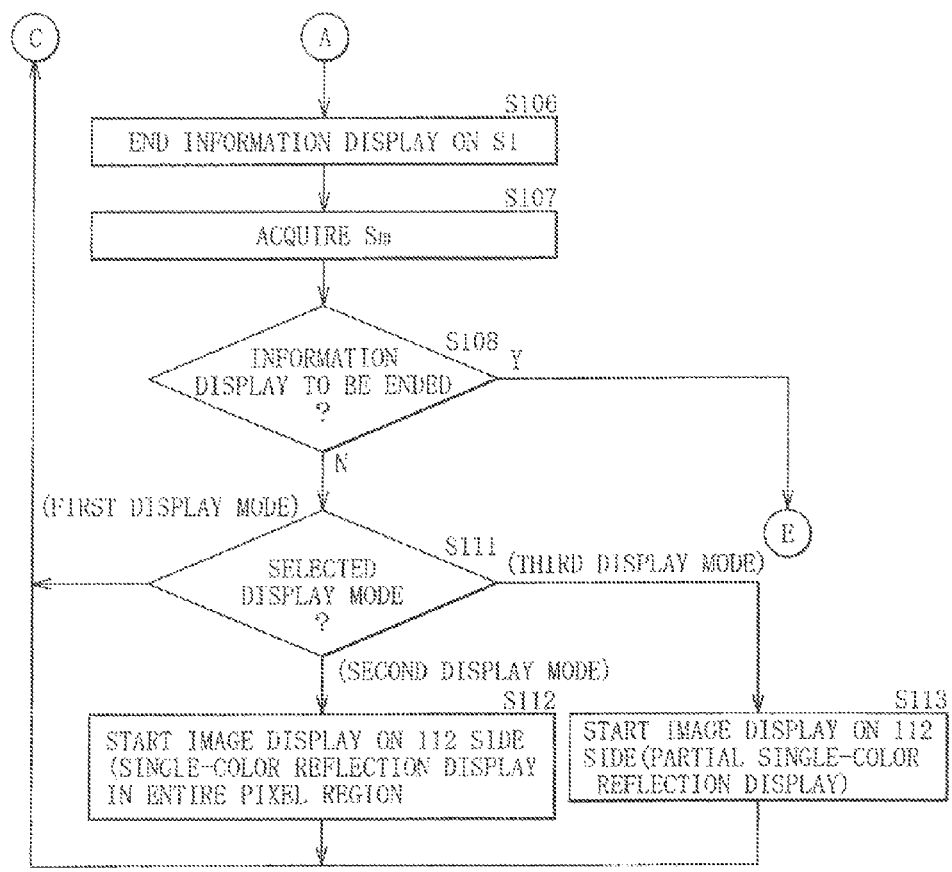
[FIG. 20]

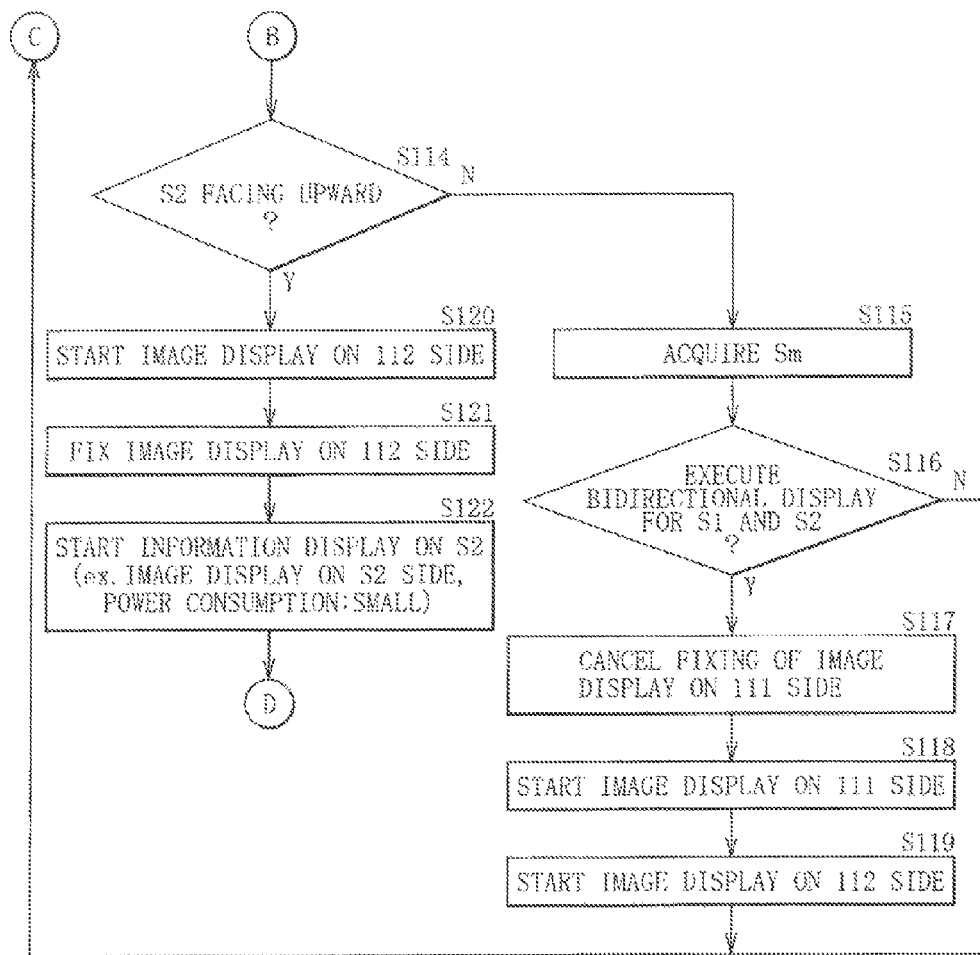

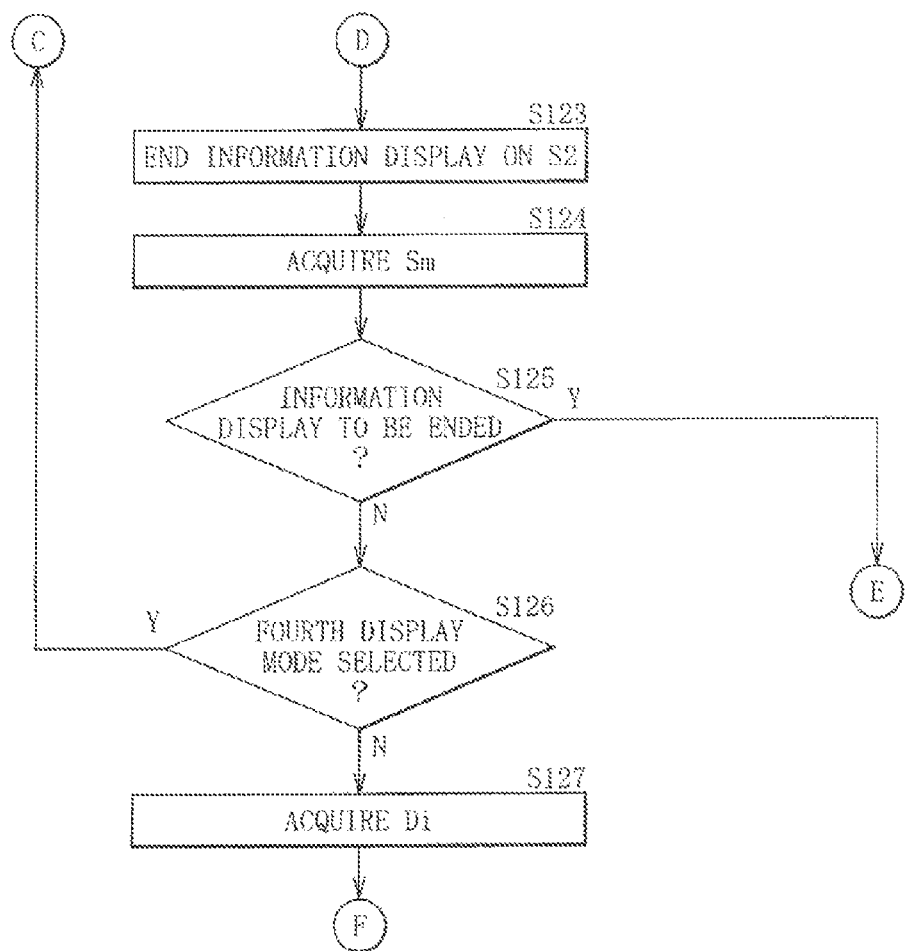

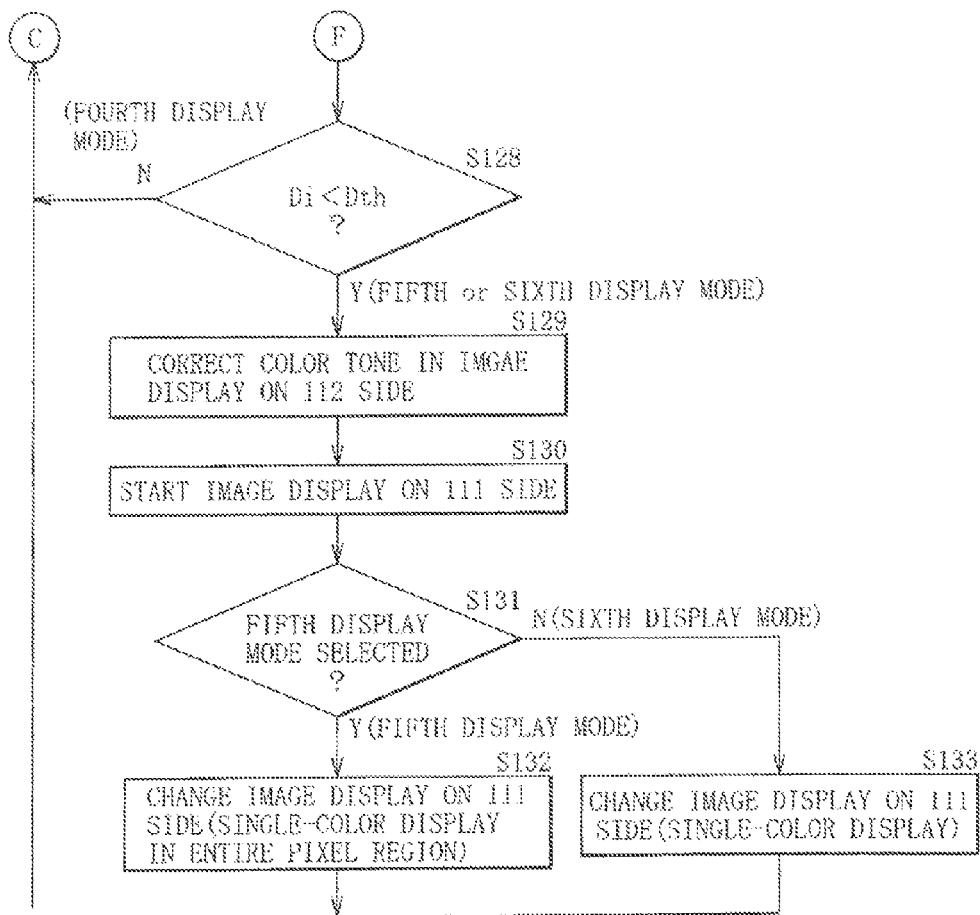

[ FIG. 24 ]
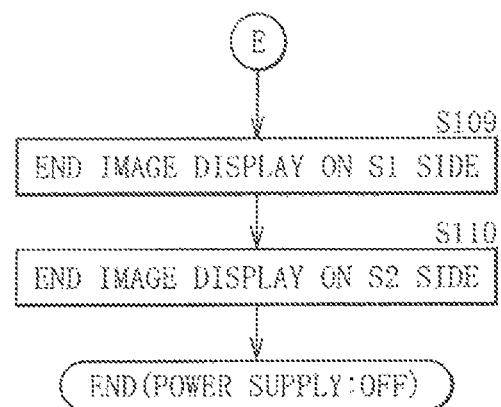

[ FIG. 25 ]
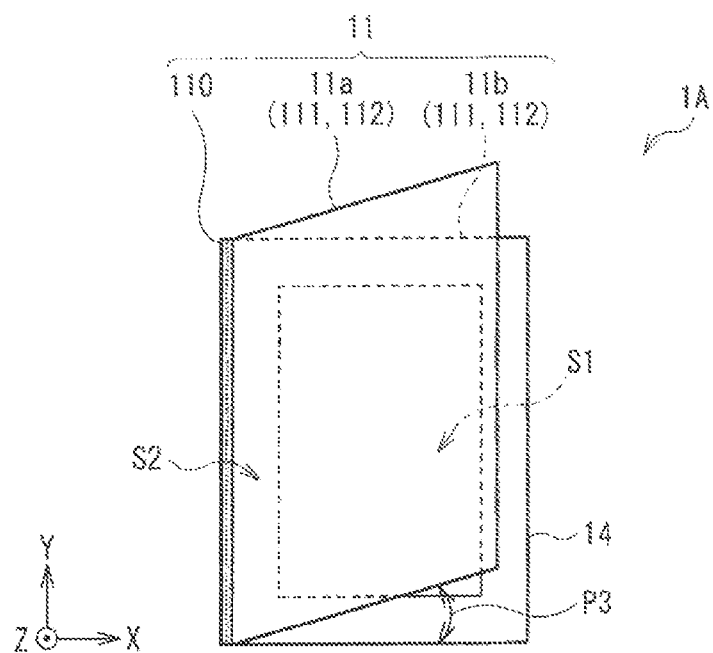
[ FIG. 26A ]
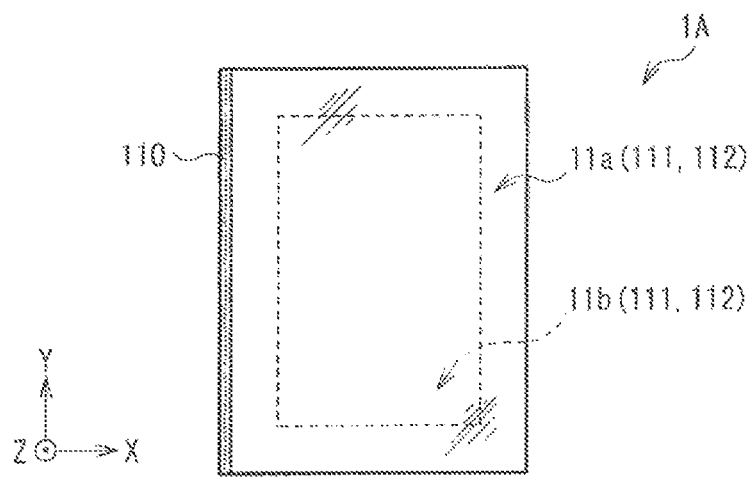

[FIG. 26B]
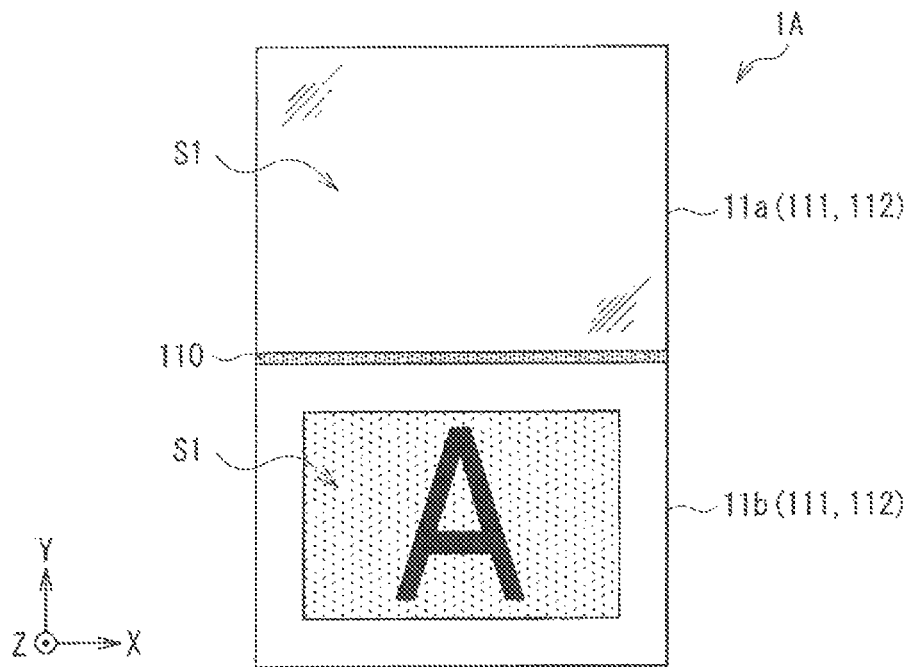
[FIG. 26C]
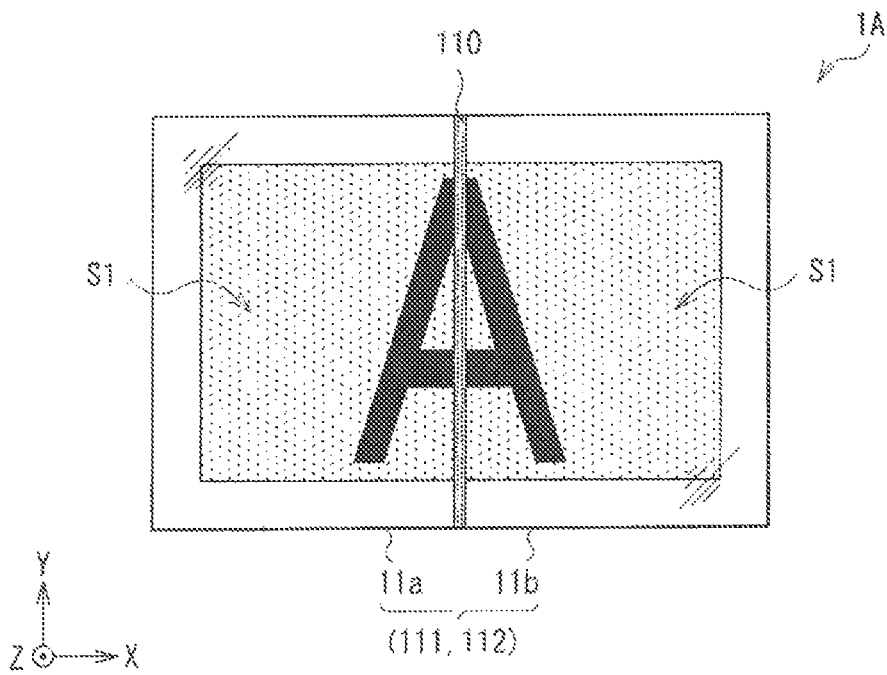

[ FIG. 27A ]
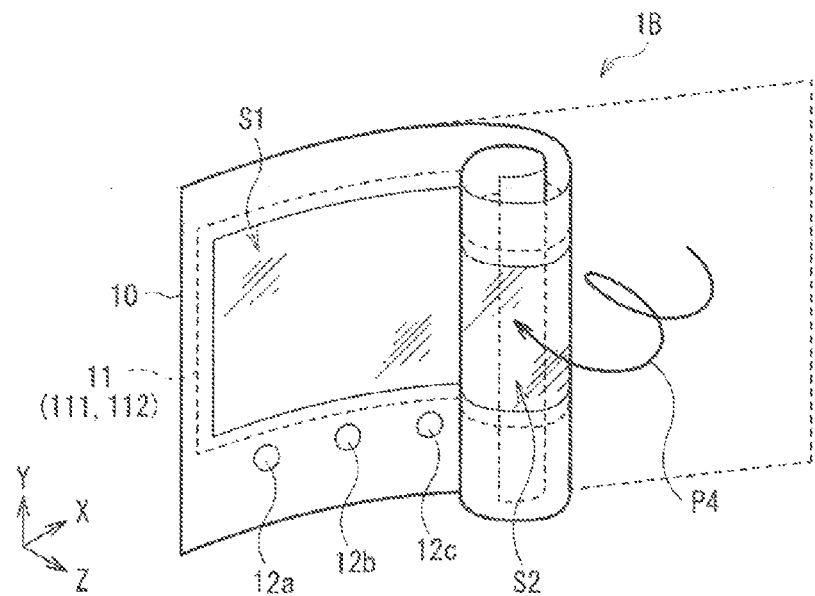
[ FIG. 27B ]
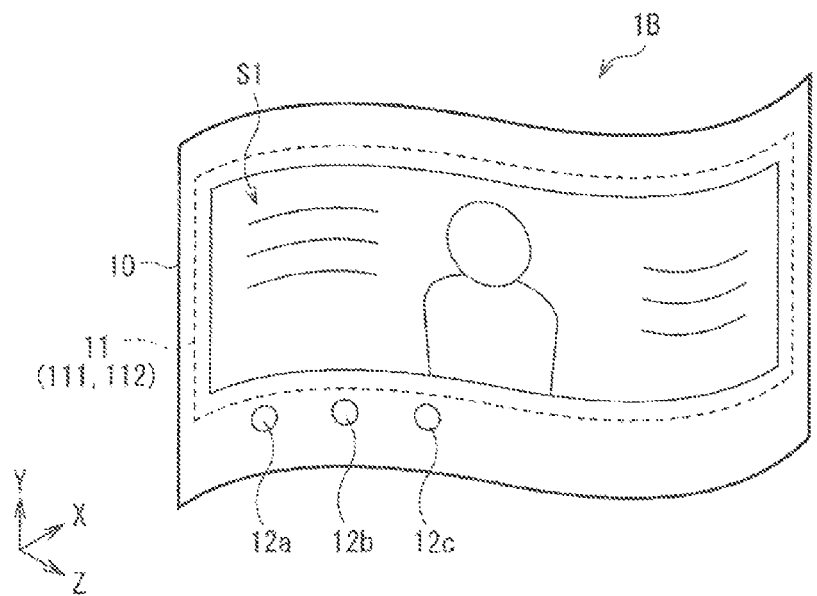

DISPLAY DEVICE AND ELECTRONIC APPARATUS

TECHNICAL FIELD

The present disclosure relates to a display device having a display section including two types of display panels, and an electronic apparatus with such a display device.

BACKGROUND ART

Various types of display devices have been proposed conventionally. For example, Patent Literature 1 discloses a display device using two types of display panels (display bodies).

CITATION LIST

Patent Literature

Patent Literature 1: Japanese Unexamined Patent Application Publication No. 2004-302321

SUMMARY

Meanwhile, in general, display devices are expected to improve convenience of users. Therefore, suggestion of a technique for improving convenience of users is desired.

Accordingly, it is desirable to provide a display device and an electronic apparatus that are capable of improving convenience of a user.

A display device according to an embodiment of the present disclosure includes a display section having a first display surface and a second display surface facing each other. This display section includes a first display panel disposed on the first display surface side, and including a plurality of light emitting elements, and a second display panel disposed on the second display surface side, and including a plurality of light control elements each performing light control for control of transmission or reflection of incident light performing reflective image display utilizing reflection of the incident light.

An electronic apparatus according to an embodiment of the present disclosure includes the display device according to the above-described embodiment of the present disclosure.

In the display device and the electronic apparatus of the embodiments of the present disclosure, image display on both of the first and second display surfaces facing each other is implemented, by utilizing the first and second display panels. In addition, since the first display panel is configured to include the above-described light emitting elements and the second display panel is configured to include the above-described light control elements, image display in which the device functions on both sides complement each other is implemented.

According to the display device and the electronic apparatus of the embodiments of the present disclosure, the display section having the above-described first and second display panels is provided, and therefore, image display on the two display surfaces facing each other is implemented by allowing the device functions of the respective display panels to complement each other. Therefore, it is possible to improve convenience of a user. It is to be noted that, an effect described herein is not necessarily limitative, and may be any of effects described in the present disclosure.

BRIEF DESCRIPTION OF DRAWINGS

FIG. 1A is a schematic plan view illustrating a configuration example of an electronic apparatus with a display device, according to an embodiment of the present disclosure.

FIG. 1B is a schematic plan view illustrating a configuration example of an opposite side of the electronic apparatus illustrated in FIG. 1A.

FIG. 2 is a block diagram schematically illustrating a schematic configuration example of the electronic apparatus illustrated in FIG. 1A and FIG. 1B.

FIG. 3A is a schematic perspective view illustrating a schematic configuration example of a display section illustrated in FIG. 2.

FIG. 3B is a schematic perspective view illustrating a schematic configuration example of the display section illustrated in FIG. 3A, when viewed from the opposite side.

FIG. 4 is a schematic cross-sectional diagram illustrating a schematic configuration example of a pixel including a light emitting element illustrated in FIG. 3A.

FIG. 5A is a schematic cross-sectional diagram illustrating an example of an action in the pixel illustrated in FIG. 4.

FIG. 5B is a schematic cross-sectional diagram illustrating another example of an action in the pixel illustrated in FIG. 4.

FIG. 6 is a schematic cross-sectional diagram illustrating a schematic configuration example of a pixel including a light control element illustrated in FIG. 3B.

FIG. 7A is a schematic cross-sectional diagram illustrating an example of an action in the pixel illustrated in FIG. 6.

FIG. 7B is a schematic cross-sectional diagram illustrating another example of an action in the pixel illustrated in FIG. 6.

FIG. 8A is a schematic plan view illustrating a state example in standby operation.

FIG. 8B is a schematic plan view illustrating another state example in the standby operation.

FIG. 9A is a schematic cross-sectional diagram for describing an action in the state illustrated in FIG. 8A.

FIG. 9B is a schematic cross-sectional diagram for describing an action in the state illustrated in FIG. 8B.

FIG. 10A is a schematic plan view illustrating an example of a display manner when a background is set in a transparent state.

FIG. 10B is a schematic plan view illustrating another example of a display manner when a background is set in a transparent state.

FIG. 11A is a schematic cross-sectional diagram for describing an action in the display manner illustrated in FIG. 10A.

FIG. 11B is a schematic cross-sectional diagram for describing an action in the display manner illustrated in FIG. 10B.

FIG. 12A is a schematic cross-sectional diagram illustrating an action in a display manner example when a background is set in a single-color reflection display state.

FIG. 12B is a schematic cross-sectional diagram illustrating an action in another display manner example when a background is set in a single-color display state.

FIG. 13A is a schematic plan view for describing the display manner illustrated in FIG. 12A.

FIG. 13B is a schematic plan view for describing the display manner illustrated in FIG. 12B.

FIG. 14 is a schematic plan view illustrating an example of a display manner when s display surface is reversed.

FIG. 15 is a schematic plan view illustrating examples of a display mode in the case illustrated in FIG. 14.

FIG. 16 is a schematic plan view illustrating another example of a display manner when a display surface is reversed.

FIG. 17 is a schematic plan view illustrating examples of a display mode in the case illustrated in FIG. 16.

FIG. 18 is a schematic diagram illustrating examples of an adaptation relationship between various indexes and each display mode.

FIG. 19 is a flowchart illustrating an example of display control according to an embodiment.

FIG. 20 is a flowchart illustrating an example of display control following FIG. 19.

FIG. 21 is a flowchart illustrating another example of display control following FIG. 19.

FIG. 22 is a flowchart illustrating an example of display control following FIG. 21.

FIG. 23 is a flowchart illustrating an example of display control following FIG. 22.

FIG. 24 is a flowchart, illustrating another example of display control following FIG. 20 and FIG. 22.

FIG. 25 is a schematic plan view illustrating a configuration example of an electronic apparatus with a display device according to Modification 1.

FIG. 26A is a schematic plan view illustrating a state example in the electronic apparatus illustrated in FIG. 25.

FIG. 26B is a schematic plan view illustrating a display manner example in the electronic apparatus illustrated in FIG. 25.

FIG. 26C is a schematic plan view illustrating another display manner example in the electronic apparatus illustrated in FIG. 25.

FIG. 27A is a schematic perspective view illustrating a configuration example of an electronic apparatus with a display device according to Modification 2.

FIG. 27B is a schematic perspective view illustrating another configuration example of the electronic apparatus illustrated in FIG. 27A.

MODES FOR CARRYING OUT THE INVENTION

An embodiment of the present disclosure will be described below in detail with reference to the drawings. It is to be noted that the description will be provided in the following order.
1. Embodiment (an example when a display device is applied to a mobile apparatus serving as an example of an electronic apparatus)
2. Modifications
   Modification 1 (an example when a display section is configured to be foldable)
   Modification 2 (an example when each display panel has flexibility)
3. Other modifications 1. Embodiment Configuration Example FIG. 1A and FIG. 1B each schematically illustrate a configuration example of an electronic apparatus (an electronic apparatus 1) with a display device according to an embodiment of the present disclosure, in a plan view (an X-Y plan view). Specifically, FIG. 1A illustrates an example of a configuration when viewed from a side where a display surface S1 (a first display surface) to be described later is provided, and FIG. 1B illustrates an example of a configuration when viewed from a side where a display surface S2 (a second display surface) to be described later is provided (when viewed from the side opposite to the display surface S1).

In this example, the electronic apparatus 1 serves as, for example, a mobile apparatus (a portable apparatus) such as a tablet terminal, a smartphone, and a mobile information terminal (PDA; Personal Digital Assistant). The electronic apparatus 1 includes a display device according to the present embodiment in a housing 10, and this display device includes a display section 11.

The display section 11 performs image display based on an image signal (image signals Sv1 and Sv2 to be described later), and has the display surfaces S1 and S2 (e.g., two display surfaces on a from side and a back side) facing each other. This display section 11 has a plurality of pixels (pixels 210 and 220 to be described later) including various display elements, on the display surfaces S1 and S2. Further, the display section 11 is configured to include, in addition, to these display elements, components such as a drive device configured by various types of TFT (Thin Film Transistor) and the like. In this example, this display section 11 is assumed to have an anisotropic shape (a rectangular shape) in which a Y-axis direction (a vertical direction) is a major-axis direction and an X-axis direction (a horizontal direction) is a minor-axis direction. It is to be noted that, this display section 11 is configured to include the two types of display panels (display bodies), and a detailed configuration example thereof will be described later (FIG. 2, FIG. 3A, FIG. 3B and so on).

The housing 10 is an outer member that houses both of the display surfaces S1 and S2 in the display section 11, winch are thereby visually recognizable. In this example, the housing 10 is assumed to have an anisotropic shape (a rectangular shape) in which a Y-axis direction is a major-axis direction and an X-axis direction is a minor-axis direction. The display surface S1 side (a bezel region of the display section 11) of the housing 10 is provided with operation sections 12a, 12b, and 12c, as illustrated in FIG. 1A. The display surface S2 side (the bezel region of the display section 11) of the housing 10 is provided with an illuminance sensor 14, as illustrated in FIG. 1B. Further, the housing 10 has a gravity position sensor 13 built therein, as illustrated in each of FIG. 1A and FIG. 1B.

The operation sections 12a, 12b, and 12c each serve as a part (such as an operation button) to be used when a user operates the electronic apparatus 1. It is to be noted that, instead of providing the operation sections 12a, 12b, and 12c, any type of various touch panels may be provided on the display section 11 (on a surface of each of the display surface S1 side and the display surface S2 side) to serve as an operation section, thereby allowing the user to operate the electronic apparatus 1.

The gravity position sensor 13 is a sensor that detects a gravity position of the electronic apparatus 1 (e.g., a posture of the electronic apparatus 1, such as information indicating which one of the surfaces of the housing 10 is directed upward). Examples of the gravity position sensor 13 include an acceleration sensor and a gyro sensor.

The illuminance sensor 14 is a sensor that detects an environmental illuminance (an illuminance of outside light entering through periphery) corresponding to brightness around the electronic apparatus 1. This illuminance sensor 14 is configured to include, for example, components such as various photodiodes having light receiving sensitivity in a visible light region.

Schematic Configuration Example

Next, with reference to FIG. 2. FIG. 3A, and FIG. 3B, a schematic configuration example of the electronic apparatus 1 (the display device) will be described. FIG. 2 schematically illustrates a schematic configuration example of the electronic apparatus 1, in a block diagram. FIG. 3A schematically illustrates a schematic configuration example of the display section 11, in a perspective view, and FIG. 3B schematically illustrates a schematic configuration example when the display section 11 illustrated in FIG. 3A is viewed from the opposite side, in a perspective view.

The electronic apparatus 1 includes, in addition to the display section 11, the operation sections 12a, 12b, and 12c, the gravity position sensor 13, and the illuminance sensor 14 described above, a display control section 15 that controls the image display in the display section 11, as illustrated in FIG. 2.

(Display Section 11)

The display section 11 is configured by overlaying (affixing together) display panels 111 and 112, along a Z-axis (a thickness direction), as illustrated in FIG. 2.

The display panel 111 (a first display panel) is disposed relatively, on the display surface S1 side (in a positive direction of the Z-axis), and is configured to output display light Ld1 toward both of a front-surface side (the display surface S1 side) and a back-surface side (the display surface S2 side) thereof. This display panel 111 has the pixels 210 two-dimensionally arranged in a matrix on the display surface S1 (an X-Y plane), for example, as illustrated in FIG. 3A. The pixels 210 each include a light emitting element 211 that performs self-light emission. The light emitting element 211 is configured to emit light (the display light Ld1) toward both of the display surface S1 side and the display surface S2 side. In the display panel 111, since this light emitting element 211 is provided as a display element, while display of relatively high definition image quality is implemented, power consumption at the time of image display is relatively high, as compared with the display panel 112 to be described below. It is to be noted that, a detailed configuration example of this light emitting element 211 will be described later (FIG. 4, FIG. 5A, FIG. 5B and so on).

The display panel 112 (the second display panel) is disposed relatively on the display surface S2 side (in a negative direction of the Z-axis), and is configured to output display light Ld2 toward both of a front-surface side (the display surface S2 side) and a back-surface side (the display surface S1 side) thereof. This display panel 112 has pixels 220 two-dimensionally arranged in a matrix on the display surface S2 (an X-Y plane), for example, as illustrated in FIG. 3B. The pixels 220 each include a light control element 221 that performs light control for control of transmission and reflection (control for switching between a transmission state and a reflection state) of incident light. This light control element 221 also serves as a reflection display element, which performs image display (reflective image display) utilizing such reflection of incident light. The light control element 221 is configured to perform such light control and reflective image display, for both of incident light entering from the display surface S1 side and incident light entering from the display surface S2 side. In the display panel 112, since this light control element 221 is used as a display element, while power consumption at the time of image display is relatively low, image quality is relatively low, as compared with the above-mentioned display panel 111. It is to be noted that, a detailed configuration example of this light control element 221 will be described later (FIG. 6, FIG. 7A, FIG. 7B and so on).

(Display Control Section 15)

The display control section 15 supplies an image signal (a drive voltage) to the display section 11 on a pixel-by-pixel basis, thereby performing the control (performing the display control) allowing the image display to be performed in this display section 11. Specifically, as will be described later in detail, the display control, section 15 individually controls image display (performs individual control of image display) in each of the display panels 111 and 112 in the display section 11. This display control section 15 has a control section 150 and two drive sections 151 and 152, as illustrated in FIG. 2.

The control section 150 controls operation of each of the drive sections 151 and 152, based on the image signals Sv1 and Sv2 input from outside, an operation signal Sm supplied from an operation section 12a, 12b, and 12c, a gravity position signal Sg supplied from the gravity position sensor 13, and an environmental illuminance Di supplied from the illuminance sensor 14. Here, the image signal Sv1 corresponds to an image signal for each of the pixels 210 in the display panel 111, and the image signal Sv2 corresponds to an image signal for each of the pixels 220 in the display panel 112. The operation signal Sm is a signal generated according to input operation of the user performed on the operation sections 12a, 12b, and 12c. The gravity position signal Sg is a signal indicating a detection result (such as posture information of the electronic apparatus 1) in the gravity position sensor 13. The environmental illuminance Di corresponds to data indicating an environmental illuminance detected in the illuminance sensor 14. It is to be noted that, this control section 150 is configured, for example, using a microcomputer.

The drive section 151 supplies a drive voltage Vd1 based on the image signal Sv1, to each of the pixels 210 in the display panel 111, according to the control by the control section 150. Similarly, the drive section 152 supplies a drive voltage Vd2 based on the image signal Sv2, to each of the pixels 220 in the display panel 112, according to the control by the control section 150. These drive sections 151 and 152 are each configured using a component such as a semiconductor chip including various drive circuits (e.g., a scanning-line driving circuit, a signal-line driving circuit, and a power-line driving circuit).

Here, as will be described later in detail, a light emission quantity changes for each of the pixels 210 and a light reflection quantity changes for each of the pixels 220, according to the drive voltage Vd1 applied to the light emitting element 211, and the drive voltage Vd2 applied to the light control element 221, in the display panels 111 and 112, respectively. Further, accompanying such a change in each of the light emission quantity and a light reflection amount, optical transparency changes for each of the pixels 210 and 220. However, a correspondence between the presence/absence of application of the drive voltages Vd1 and Vd2 (voltage magnitude), and the presence/absence of the optical transparency (degree) is not limited to a correspondence to be described later, and may be other correspondence (for example, a reverse correspondence).

Cross Sectional Configuration Example

Next, a cross sectional configuration example of each of the display panels 111 and 112 (the pixels 210 and 220) will be described with reference to FIG. 4, FIG. 5A, FIG. 5B, FIG. 6, FIG. 7A, and FIG. 7B.

(Display Panel 111)

FIG. 4 schematically illustrates a schematic configuration example of the display panel 111 (the pixel 210), in a cross-sectional diagram. The pixels 210 in the display panel 111 are each configured to include the light emitting element 211 configured by an organic electroluminescence (Electro Luminescence) device (an organic electroluminescence element), in this example.

In this example, the display panel 111 is configured to perform color image display, by outputting the display light Ld1 toward both of the display surface S1 side and the display surface S2 side as described above, by using a configuration based on a top-surface light emission system (a so-called top emission system). In other words, the pixels 210 are each configured to emit the display light 141 corresponding to, for example, any one of red (R), green (G), and B (blue) in three primary colors.

The light emitting element 211 (the organic EL device) in each of the pixels 210 is sealed on a drive substrate 30 by a sealing substrate 37. In each of the light emitting elements 211, an inter-pixel insulating film 32, an organic layer 33, and a second electrode (an upper electrode) 34 are laminated in this order on a first electrode (a lower electrode) 31. In the display panel 111, a protective film 35 is formed to cover each, of the light emitting elements 211, and, on this protective film 35, the sealing substrate 37 is laminated with a black matrix 36 interposed therebetween. The organic layer 33 includes layers such as a hole injection layer, a hole transport layer, a light emitting layer, and an electron transport layer, which are not illustrated. Of these, the light emitting layer is a layer that emits color light different for each of the pixels 210 corresponding to the above-described three primary colors (a red light emitting layer, a green light emitting layer, or a blue light emitting layer), and is colored for each of these pixels 210, to form a predetermined pattern. Further, in a region between the pixels 210 on the protective film 35, the black matrix 36 is provided.

It is to be noted that, for example, a color filter corresponding to the above-described three primary colors may be provided on at least one of the display surface S1 side (the upper part) and the display surface S2 side (the lower part) of the light emitting element 211, for purposes such as making an improvement in contrast at the time of Image display. Further, in this example, the display panel 111 is configured based on the top-surface light emission system, but is not limited to this system, and may be configured based on, for example, a bottom-surface light emission system (a so-called bottom emission system).

Here, in the display panel 111, each of the layers is configured using a light transmissive material (a transparent material) so that at least a part thereof exhibits optical transparency (transparency) in each of the layers described above. Specifically, the drive substrate 30 and the sealing substrate 37 are each configured using, for example, a substrate such as a glass substrate and a light-transmissive resin substrate. Further, the first electrode 31, the second electrode 34, and components such, as an electrode and wiring of each of the devices on the drive substrate 30 are each made of for example, a transparent oxide semiconductor such as ITO, IZO (Indium Zink Oxide), and AZO (Aluminum Zink Oxide), or a light transmissive material such as transparent carbon. The layers such as the organic layer 33 and the protective film 35 are also each made of various light transmissive materials.

In the display panel 111 having such a configuration, the light emission quantity changes for each of the pixels 210, according to the drive voltage Vd1 applied to each of the light emitting elements 211. Further, a light transmission quantity also changes accompanying such a change in the light emission quantity, and as a result, the optical transparency changes for each of the pixels 210.

Specifically, when the drive voltage Vd1 is not applied to the light emitting element 211 (or the voltage value thereof is small) in the pixel 210, both of outside light Le entering from the display surface S1 side and outside light Le entering from the display surface S2 side pass through the pixel 210, for example, as illustrated in FIG. 5A. In other words, at this time, the corresponding pixel 210 in the display panel 111 exhibits the optical transparency (transparency), and thus in a transparent state.

On the other hand, for example, as illustrated in FIG. 5B, when the drive voltage Vd1 is applied to the light emitting element 211 (or the voltage value thereof is large) in the pixel 210, the emission light (the display light Ld1) is output toward both of the display surface S1 side and the display surface S2 side from the light emitting element 211 as described above. In other words, at this time, the corresponding pixel 210 in the display panel 111 does not exhibit the optical transparency, and thus in a non-transparent state (in a display state based on the display light Ld1).

(Display Panel 112)

FIG. 6 schematically illustrates a schematic configuration example of the display panel 112 (the pixel 220), in a cross-sectional diagram. In this example, the pixels 220 in the display panel 112 are each configured to include the light control element 221 configured by a liquid crystal device including a cholesteric liquid crystal.

The display panel 112 also performs color image display, as with the display panel 111. In other words, the pixels 220 are each configured to output the display light Ld2 corresponding to any one of red (R), green (G), and B (blue) in the three primary colors, for example.

In this display panel 112, between a drive substrate 40 and a transparent substrate 45, a pixel electrode 41, a liquid crystal layer 42, a common electrode 43, and a black matrix 44M or a color filter 44C are provided in this order from the drive substrate 40 side. The color filter 44C is disposed for each of the pixels 220, and the black matrix 44M is disposed in a region between the pixels 220. The liquid crystal layer 42 is configured by the cholesteric liquid crystal. Of these, the pixel electrode 41, the liquid crystal layer 42, and the common electrode 43 are used to configure the light control element 221 (the liquid crystal device).

Here, in the display panel 112, as with the display panel 111, each of the layers is configured using a light transmissive material so that at least a part thereof exhibits the optical transparency in each of the layers described above. Specifically, the drive substrate 40 and the transparent substrate 45 are each configured using, for example, a substrate such as a glass substrate and a light-transmissive resin substrate. Further, for example, the pixel electrode 41, the common electrode 43, and components such as an electrode and wiring of each of the devices on the drive substrate 40 are each made of, for example, a transparent oxide semiconductor such as ITO, IZO, and AZO, or a light transmissive material such as transparent carbon.

In the display panel 112 (the pixel 220) having such a configuration, the light reflection quantity changes for each of the pixels 220, according to the drive voltage Vd2 applied to each of the light control elements 221. Further, a light transmission quantity also changes accompanying such a change in the light emission quantity, and as a result, the optical transparency changes for each of the pixels 220, as with the display panel 111.

Specifically, when the drive voltage Vd2 is not applied to the light control element 221 (or the voltage value thereof is small) in the pixel 220, both of the outside light Le entering from the display surface S1 side and the outside light Le entering from the display surface S2 side pass through the pixel 220 (the light control element 221), for example, as illustrated in FIG. 7A. In other words, at this time, the corresponding pixel 220 in the display panel 112 exhibits the optical transparency (transparency), and thus in a transparent state.

On the other hand, for example, as illustrated in FIG. 7B, when the drive voltage Vd2 is applied to the light control element 221 (or the voltage value thereof is large) in the pixel 220, the following occurs. That is, in the pixel 220 (the light control element 221), the light control for causing reflection is performed, for both of the incident light (such as the outside light Le) entering from the display surface S1 side and the incident light (such as the outside light Le) entering from the display surface S2 side, as described above. As a result, the display light Ld2 based on the incident light is output toward both of the display surface S1 side and the display surface S2 side, so that the reflective image display is performed. In other words, at this time, the corresponding pixel 220 in the display panel 112 does not exhibit the optical transparency, and thus in a non-transparent state (in a display state based on the display light Ld2).

Action and Effect (A. Basic Operation)

In this electronic apparatus 1 (the display device), the image signals Sv1 and Sv2 for the display panels 111 and 112 are each supplied to the control section 150 in the display control section 15, for example, as illustrated in FIG. 2. Further, the operation signal Sm from the operation sections 12a, 12b, and 12c, the gravity position signal Sg from the gravity position sensor 13, and the environmental illuminance Di from the illuminance sensor 14 are each supplied to this control section 150. The control section 150 controls operation of each of the drive sections 151 and 152, based on the image signals Sv1 and Sv2, the operation signal Sm, the gravity position signal Sg, and the environmental illuminance Di. The drive sections 151 and 152 supply the drive voltages Vd1 and Vd2 based on the image signals Sv1 and Sv2, according to the control by this control section 150, to the pixels 210 and 220 in the display panels 111 and 112, respectively.

In this way, the image display in each of the display panels 111 and 112 is individually controlled by the display control section 15 (the individual control of the image display is performed). Further, the display panel 111 is disposed relatively on the display surface S1 side, and outputs the display light Ld1 toward both of the display surface S1 side and the display surface S2 side. Furthermore, the display panel 112 is disposed relatively on the display surface S2 side, and outputs the display light Ld2 toward both of the display surface S1 side and the display surface S2 side. As a result, in this electronic apparatus 1 (the display device), by utilizing these two types of the display panels 111 and 112, the image display (double-sided display) is implemented on both of the display surfaces S1 and S2 facing each other.

(B. Summary of Action in Each Operation)

Next, a summary of an action in each operation (standby operation and image display operation) of the electronic apparatus 1 (the display device) will be described with reference to figures including FIG. 8A to FIG. 13B.

(In Standby Operation)

First, in the standby operation (in a standby state) of the electronic apparatus 1, the display control is performed so that pixel regions (regions where the pixels 210 and 220 are disposed) in the respective display panels 111 and 112 are both in the transparent state, for example, as illustrated in FIG. 8A and FIG. 8B. In other words, the display control section 13 performs the display control so that the pixel regions in the respective display panels 111 and 112 are both in the transparent state, when the electronic apparatus 1 being in the standby state is detected based on the signal such as the operation signal Sm.

It is to be noted that, an example illustrated in FIG. 8A represents a state where the user holds the electronic apparatus 1 being in the standby state with a hand h so that the display surface S1 faces upward. Further, an example illustrated in FIG. 8B represents a state where the user holds the electronic apparatus 1 being in the standby state with the hand b so that the display surface S2 faces upward.

Here, in the example in each of FIG. 8A and FIG. 8B, the display control section 15 supplies neither the drive voltage Vd1 to the pixels 210 in the display panel 111, nor the drive voltage Vd2 to the pixels 220 in the display panel 112, for example, as illustrated in FIG. 9A and FIG. 9B. Therefore, in each of the display panels 111 and 112, both of the outside light Le entering from the display surface S1 side and the outside light Le entering from the display surface S2 side pass through each of the pixels 210 and 220, as described above. As a result all the pixels 210 and 220 in the display panels 111 and 112 exhibit the optical transparency, and thus in the transparence state illustrated in FIG. 8A and FIG. 8B.

In this way, in the standby state of the electronic apparatus 1 (the display device), the display section 11 is in the transparent state (a transparent panel), when viewed from either of the display surface S1 side and the display surface S2 side. Therefore, a display design with an advanced brightness impression can be implemented.

(In Image Display Operation: Background Being in Transparent State)

Next in the image display operation of the electronic apparatus 1, there is, as a first example, a case where a part of the display section 11 displays an image, while a background part of the image is in the transparent state, for example, as illustrated in FIG. 10A and FIG. 10B. In other words, the display control section 15 performs, the display control in the display panels 111 and 112, to allow such a partial image display state and transparent state, when an instruction for setting such a display mode is provided.

It is to be noted that, the example illustrated in FIG. 10A represents a state where the user holds the electronic apparatus 1 with the hand h so that the display surface S1 faces upward, while an image (a letter "A") is displayed on a portion of the display surface S1 of the electronic apparatus 1. Further, the example illustrated in FIG. 10B represents a state where the user holds the electronic apparatus 1 with the hand h so that the display surface S2 faces upward, while an image (a letter "B") is displayed on a portion of the display surface S2 of the electronic apparatus 1.

At this time, in the example in FIG. 10A, the display control section 15 performs the following display control in the display panel 111, for example, as illustrated in FIG. 11A. That is, the drive voltage Vd1 is supplied to the pixel 210 in a display pixel region, whereas the drive voltage Vd1 is not supplied to the pixel 210 in a background region (a non-display pixel region). On the other hand, in this first example, the display control section 15 does not supply the drive voltage Vd2 to all the pixels 220 in the display panel 112. Therefore, in the display pixel, region in the display panel 111, the emission light (the display light Ld1) is output from the light emitting element 211 toward both of the display surface S1 side and the display surface 82 side as described above, and thus the non-transparent state is established. Meanwhile, in the background region in the display panel 111, both of the outside light Le entering from the display surface S1 side and the outside light Le entering from the display surface S2 side pass therethrough as described above, and thus the transparent state is established. On the other hand, in the display panel 112, both of the outside light Le entering from the display surface S1 side and the outside light Le entering from the display surface S2 side as described above pass through all the pixels 220, and thus the transparent state is established. In this way, as illustrated in FIG. 10A, when the display surface S1 faces upward, the partial image display state and the transparent state of the display section 11 are implemented. It is to be noted that, in this case, the display light Ld1 is output toward both of the display surfaces S1 and S2, and therefore, the image display (the letter "A") is visibly recognizable not only from the display surface S1 side (the upper side) but also from the display surface S2 side (the lower side).

On the other hand, in the example in FIG. 10B, the display control section 15 performs the following display control in the display panel 112, for example, as illustrated in FIG. 11B. That is, the drive voltage Vd2 is supplied to the pixel 220 in a display pixel region, whereas the drive voltage Vd2 is not supplied to the pixel 220 in a background region (a non-display pixel region). On the other hand, in this first example, the display control section 15 does not supply the drive voltage Vd1 to all the pixels 210 in the display panel 111. Therefore, in the display pixel region in the display panel 112, as for the incident light (such as the outside light Le) entering from both, of the display surfaces S1 and S2 sides, the display light Ld2 based on the incident light is output toward tire display surface S1 side and the display surface S2 side as described above, and the reflective image display is performed. In other words, since the incident light is reflected, the display pixel region 210 is in the non-transparent state. Meanwhile, in the background region in the display-panel 112, both of the outside light Le entering from the display surface S1 side and the outside light Le entering from the display surface S2 side pass therethrough as described above, and thus the transparent state is established. On the other hand, in the display panel 111, in all the pixels 210, both of the outside light Le entering from the display surface S1 side and the outside light Le entering from the display surface S2 side pass therethrough as described above, and thus the transparent state is established. In this way, the partial image display state and the transparent state of the display section 11 are implemented as illustrated in FIG. 10B, when the display surface S2 faces upward. It is to be noted that, in this case as well, the display light Ld2 is output toward both of the display surfaces S1 and S2, and therefore, the image display (the letter "B") is visibly recognizable not only from the display surface S2 side (the upper side) but also from the display surface S1 side (the lower side).

In this way, in the first example of the image display operation of the electronic apparatus 1 (the display device), while the display section 11 partially displays the image, the display section 11 is in the transparent state in the background part thereof, when viewed from either of the display surface S1 side and the display surface S2 side, as in the standby state described above. Therefore, it is possible to perform necessary image display, while maintaining an advanced brightness impression to a certain extent.

However, in this first example, the following disadvantage may occur depending on situation, and thus the convenience of the user may decrease.

Specifically, in the example (the example where the display surface S1 faces upward) illustrated in FIG. 10A and FIG. 11A, the display light Ld1 is emitted from the light emitting element 211 in the display pixel region toward both of the display surfaces S1 and S2 sides as described above, and the display light Ld1 emitted toward the display surface S2 side passes through the display panel 112. Therefore, when the displayed image is viewed from the display surface S1 side (or the display surface S2 side), the display luminance in that direction (one side) is relatively a half (½) value, and thus, contrast may decrease, which may lead to degradation of display image quality.

On the other hand, in the example (the example where the display surface S2 faces upward) illustrated in FIG. 10B and FIG. 11B, the reflective image display based on the incident light such as the outside light Le is performed in the light control element 221 in the display pixel region, as described above. In this case, in a dark environment where the outside light Le is little (in a situation where the environmental illuminance is low), the displayed image is not readily viewed for is hardly visible).

(In Image Display Operation: Background Being in Single-Color Reflection Display State or Single-Color Display State)

Therefore, in the image display operation, of the electronic apparatus 1, there is, as a second example, a case where the display control section 15 performs the display control, for example, as illustrated in FIG. 12A and FIG. 12B.

It is to be noted that, as with the example in FIG. 10A and FIG. 11A, the example illustrated in FIG. 12A represents a state where the display surface S1 faces upward, and the image (the letter "A") is partially displayed on this display surface S1. In addition, as with the example in FIG. 10B and FIG. 11B, the example illustrated in FIG. 12B represents a state where the display surface S2 faces upward, and the image (the letter "B") is partially displayed on this display surface S2.

Here, in the example in FIG. 12A, the display control section 15 performs the display control similar to that in the first example (the example in FIG. 10A and FIG. 11A), in the display panel 111. In other words, the drive voltage Vd1 is supplied to the pixel 210 in the display pixel region, whereas the drive voltage Vd1 is not supplied to the pixel 210 in the background region. However, in this second example, unlike the first example, the display control section 15 supplies the same (common) drive voltages Vd2 to all the pixels 220 in the display panel 112. Therefore, the entire pixel region in the display panel 112 is in the single-color reflection display state (e.g., a full-white display state) based on the reflective image display. Accordingly, the display light Ld1 emitted front the light emitting element 211 in the display pixel region toward the display surface S2 side is reflected by the light control element 221 in the display panel 112, and eventually output toward the display surface S1 side. In other words, by utilizing the light control (the light reflection) in the light control element 221 in the display panel 112, an effect of reinforcing (supplementing) the contrast in the image display in the display panel 111 (an effect of improving utilization efficiency of the display light Ld1) can be obtained.

As a result, for example, as illustrated in FIG. 13A, in this second example, when the displayed image is viewed from the display surface S1 side, a decrease of the contrast accompanying a decrease of the display luminance is reduced or evaded, and the display image quality improves (the convenience of the user improves), as compared with the first example. If is to be noted that, in this example in FIG. 13A, since the entire pixel region in the display panel 112 is in the single-color reflection display state, the background part in the display section 11 is also in the single-color reflection display state (the non-transparent state), unlike the first example illustrated in FIG. 11A.

On the other hand, in the example in FIG. 12B, the display control section 15 performs the display control similar to that in the first example (the example in FIG. 10B and FIG. 11B) in the display panel 112. In other words, the drive voltage Vd2 is supplied to the pixel 220 in the display pixel region, whereas the drive voltage Vd2 is not supplied to the pixel 220 in the background region. However, in this second example, unlike the first example, the display control section 15 supplies the same (common) drive voltages Vd1 to all the pixels 210 in the display panel 111. Therefore, the entire pixel region in the display panel 111 is in the single-color display state (e.g., a full-white display state or a specific-color display state) based on the light emission of the light emitting element 211. In other words, the display light Ld1 output from the display panel 111 (toward the display surface S1 side) can be supplementally utilized in the image display in the display panel 112, so that this display panel 111 serves as an auxiliary light source (a backlight).

As a result, in this second example, unlike the first example, when the displayed image is viewed from the display surface S2 side, for example, as illustrated in FIG. 13B, the displayed image is readily viewed (the convenience of the user improves), even in a dark environment where the outside light Le is little (in a situation where the environmental illuminance is low). It is to be noted that, in this example in FIG. 13B as well, since the entire pixel region in the display panel 111 is in the single-color display state, the background, part in the display section 11 is also in the single-color display state (the non-transparent state), unlike the first example illustrated in FIG. 11B.

In this way, when the second example is used in the image display, the function (a device function) of the light emitting element 211 in the display panel 111 and the function of the light control element 221 in the display panel 112 complement each other, thereby implementing the image display on the display surfaces S1 and S3 (the double-sided display). As a result, an improvement of convenience to the user can be expected.

(C. A Plurality of Types of Display Modes)

Next a plurality of types (six types, in this example) of display modes settable in the electronic apparatus 1 (the display device) will be described with reference to figures including FIG. 14 to FIG. 18. In other words, the display control section 15 performs the individual control of the image display in each of the display panels 111 and 112, to execute one display mode selected from the plurality of types of display modes utilizing a change in the optical transparency for each of the pixels 210 and 220 described above.

It is to be noted that, as will be described later in detail, such a display mode can be arbitrarily set (selected, or switched), depending on, for example, power saving, ambient light environment, screen design or image quality preference (selectivity), image type, and so on. In addition, for the way of making such a selection, there may be utilized only one of, or a combination of, manual selection, (manual control) utilizing input operation performed by the user on the operation sections 12a, 12b, and 12c, and automatic selection (automatic control) utilizing information such as a detection result in the illuminance sensor 14 to be described later.

(First to Third Display Modes: Display Surface S1 Facing Upward)

First, three types of display modes (first to third display modes) among the above-described six types of display modes will be described with reference to figures including FIG. 14 and FIG. 15. These first to third display modes are each provided as a display mode to be set when the display surface S1 facing upward is detected, as will be described below.

Here, the description will be provided using, as an example, a case where the electronic apparatus 1 (the display device) is reversed (turned upside down), by being changed from a state where the display surface S2 faces upward as illustrated in, for example, Part (A) of FIG. 14, to a state where the display surface S1 faces upward as illustrated in, for example, Part (B) of FIG. 14 (see an arrow P11 in FIG. 14).

In this case, when occurrence of a change from the state where the display surface S2 faces upward to the state where the display surface S1 faces upward is determined, by the gravity position signal Sg obtained in the gravity position sensor 13, the display control section 15 performs the display control as follows. That is, control of switching the image display from a state of displaying the image (the partial display of displaying the letter "B" in this example) in the display panel 112 on the display surface S2 side as illustrated in, for example, Part (A) of FIG. 14, to a state of displaying the identical image is the display panel 111 on the display surface S1 side as illustrated in, for example, Part (B) of FIG. 14.

It is to be noted that, at this time, for example, the following information may be temporarily displayed on the display section 11 (the display surface S1), as indicated by, for example, a reference numeral P12 in Part (B) of FIG. 14. That is, for example, information indicating "power consumption increasing" or "high definition image quality mode starting", due to switching from the image display state in the display panel 112 to the image display state in the display panel 111, may be temporarily displayed. In addition, index information of power consumption (e.g., information, such as a built-in battery duration in the electronic apparatus 1) in the selected display mode may be displayed on the display section 11 (the display surface S1). When these kinds of information are displayed, useful information is provided to the user, and therefore, a further improvement of convenience to the user can be expected.

Further, when the image display (the display light Ld1 being output toward both of the display surface S1 and S2 sides) by the light emitting element 211 is thus performed in at least a part of the pixel region in the display panel 111 on the display surface S1 side, the display control section 15 performs the following display control. That is, the individual control of the image display in each of the display panels 111 and 112 is performed to execute (set) one display mode selected from the first to third display modes to be described below.

Here, when the first display mode is set, an image is displayed as illustrated in, for example, Part (A) of FIG. 15. Specifically, in the display panel 111 on the display surface S1 side (the front side), the display control section 15 performs the display control so that the image display is performed by utilizing the emission state by the light emitting element 211, as described above. On the other hand, in the display panel 112 on the display surface S2 side (the back side), the display control section 15 performs the display control so that the entire pixel region of the display panel 112 is in the transparent state (a light transmission state), by utilizing the transmission of the incident light (such as the outside light Le) by the light control element 221. In other words, this first display mode corresponds to the example in FIG. 10A and FIG. 11A described above (the first example in the image display).

In this first display mode, while the display section 11 (the display surface S1) partially displays the image, the display section 11 is in the transparent state is the background part thereof, when viewed from either of the display surface S1 side and the display surface S2 side, as described above. Therefore, it is possible to perform necessary image display, while maintaining an advanced brightness impression to a certain extent.

Further, when the second display mode is set, an image is displayed as illustrated in, for example, Part (B) of FIG. 15. Specifically, for the display panel 111 on the display surface S1 side, the display control section 15 performs the display control in a manner similar to that in the first display mode. On the other hand, in the display panel 112 on the display surface S2 side, the display control section 15 performs the display control so that the entire pixel region of the display panel 112 is in the single-color reflection display state, by utilizing the reflective image display based on the incident light (such as the display light Ld1, and the outside light Le) by the light control element 221. In other words, this second display mode corresponds to the example in FIG. 12A and FIG. 13A described, above (the second example in the image display).

In this second display mode, as described above, when the displayed image is viewed from the display surface S1 side, a decrease of the contrast accompanying a decrease of the display luminance is reduced or evaded, and as a result, the display image quality improves and thus the convenience of the user improves, as compared with the first display mode.

When the third display mode is set, an image is displayed as illustrated in, for example, Part (C) of FIG. 15. Specifically, for the display panel 111 on the display surface S1 side, the display control section 15 performs the display control in a manner similar to that of each of the first and second modes. On the other hand, in the display panel 112 on the display surface S2 side, the display control is performed to establish the partial single-color reflection display state and the transparent state. Specifically, the display control is performed so that a vicinity of a pixel region corresponding to (facing) the display pixel region in the display panel 111 is in the single-color reflection display state, on a principle similar to that in the second display mode. In addition, the display control is performed so that a non-display pixel region (a transparent pixel region or background region) vicinity in the display panel 111 is in the transparent state, on a principle similar to that in the first display mode. In other words, in this third display mode, the partial single-color reflection display in the display panel 112 on the back side is performed by establishing association with the displayed image in the display panel 111 on the front side.

In this third display mode, first, as with the first display mode, while the display section 11 (the display surface S1) partially displays the image, the display section 11 is in the transparent state in the background part thereof when viewed from either of the display surface S1 side and the display surface S2 side. Further, in the display pixel region, the image display by selective superposition in both of the display panels 111 and 112 is performed and thus, an effect of improving the contrast on a principle similar to that in the second display mode is selectively obtained in the display pixel region. Therefore, advantages of both of the first and second display modes are achievable, which makes it possible to perform necessary image display of high definition image quality, while maintaining an advanced brightness impression to a certain extent. As a result, in this third display mode, a further improvement of convenience to the user can be expected.

Here, such selection of one display mode from the first to third display modes is set for example, according to the operation, signal Sm obtained by the input operation performed on the operation sections 12a, 12b, and 12c as described above. In addition, other setting, such as setting of color (for example, an arbitrary color other than white described above, such as red, green, and blue) in the single-color reflection display state in the display panel 112 in the second and third display modes, and setting of the portion of the pixel region to be in the single-color reflection display state or the transparent state in the third display mode, may also be arbitrarily adjustable (settable) according to this operation signal Sm. In such a case, these kinds of setting are arbitrarily adjustable according to preference of the user or a use environment, and therefore, a further improvement of convenience to the user can be expected.

In this way, in the electronic apparatus 1, when the display surface S1 facing upward is detected, any of the first to third display modes is arbitrarily suitable according to, for example, various indexes to be described later, and therefore, a further improvement of convenience to the user can be expected.

(Fourth to Sixth Display Modes: Display Surface S2 Facing Upward)

Next, the remaining three types of display modes (the fourth to sixth display modes) among the six types of display modes described above will be described with reference to figures including FIG. 16 and FIG. 17. These fourth to sixth display modes are each provided as a display mode to be set when the display surface S2 facing upward is detected, as will be described below.

Here, the description will be provided using, as an example, a case where the electronic apparatus 1 (the display device) is reversed (turned upside down), by being changed from a state where the display surface S1 faces upward as illustrated in, for example, Part (A) of FIG. 16, to a state where the display surface S2 faces upward as illustrated in, for example, Part (B) of FIG. 16 (see an arrow P21 in FIG. 16).

In this case, when occurrence of a change from the state where the display surface S1 faces upward to the state where the display surface S2 faces upward is determined by the gravity position signal Sg obtained in the gravity position sensor 13, the display control section 15 performs the display control as follows. That is, control of switching the image display, from a state of displaying the image (the partial display of displaying the letter "A" in this example) in the display panel 111 on the display surface S1 side as illustrated in, for example, Part (A) of FIG. 16, to a state of displaying the identical image in the display panel 112 on the display surface S2 side as illustrated in, for example, Part (B) of FIG. 16.

It is to be noted that, at this time, for example, the following information may be temporarily displayed on the display section 11 (the display surface S2), as indicated by, for example, a reference numeral P22 in Part (B) of FIG. 16. That is, for example, information indicating "power consumption decreasing" or "carry mode starting", due to switching from the image display state in the display panel 111 to the image display state in the display panel 112, may be temporarily displayed. Further, in this case as well, as described above, the index information of power consumption in the selected display mode may be displayed on the display section 11 (the display surface S2). Furthermore, in this case, an index value of the environmental illuminance Di detected by the illuminance sensor 14 may be displayed on the display section 11 (the display surface S2). When these kinds of information are displayed, useful information is provided to the user, and therefore, a further improvement of convenience to the user can be expected.

Further, when the reflective image display (the display light Ld2 being output toward both, of the display surface S1 and S2 sides) by the light control element 221 is thus performed in at least a part of the pixel region in the display panel 112 on the display surface S2 side, the display control section 15 performs the following display control. That is, the individual control of the image display in each of the display panels 111 and 112 is performed, to execute (set) one display mode selected from the fourth to sixth display modes to be described below.

Here, when the fourth display mode is set, an image is displayed as illustrated in, for example, Part (A) of FIG. 17. Specifically, is the display panel 112 on the display surface S2 side (the front side), the display control section 15 performs the display control so that the reflective image display is performed (become the light reflection state) by utilizing the reflection of the incident light (such as the outside light Le) by the light control element 221, as described above. On the other hand, in the display panel 111 on the display surface S1 side (the back side), the display control section 15 performs the display control so that the entire pixel region of the display panel 111 is in the transparent state (a light transmission state), by utilizing the non-emission state (a light extinction state) by the light emitting element 211. In other words, this fourth display mode corresponds to the example in FIG. 10B and FIG. 11B described above (the first example in the image display).

In this fourth display mode, while the display section 11 (the display surface S2) partially displays the image, the display section 11 is in the transparent state in the background part thereof, when viewed from either of the display surface S1 side and the display surface S2 side, as described above. Therefore, it is possible to perform necessary image display, while maintaining an advanced brightness impression to a certain extent.

Further, when the fifth display mode is set, an image is displayed as illustrated in, for example, Part (B) of FIG. 17. Specifically, for the display panel 112 on the display surface S2 side, the display control section 15 performs the display control in a manner similar to that in the fourth display mode. On the other hand, in the display panel 111 on the display surface S1 side, the display control section 15 performs the display control so that the entire pixel region of the display panel 111 is in the single-color display state, by utilizing the emission state (a lighting state) by the light emitting element 211. In other words, this fifth display mode corresponds to the example in FIG. 12B and FIG. 13B described above (the second example in the image display).

In this fifth display mode, as described above, the display panel 111 serves as the auxiliary light source. Therefore, unlike the fourth display mode, when the displayed image is viewed from the display surface S2 side, the displayed image is readily viewed even in a dark environment where the outside light Le is little and thus, the convenience of the user improves. Moreover, it is possible to implement an effect such as making the displayed image viewed from the display surface S2 side and the displayed image viewed from the display surface S1 side different from each other in terms of image feeling.

When the sixth display mode is set an image is displayed as illustrated in, for example, Part (C) of FIG. 17. Specifically, for the display panel 112 on the display surface S2 side, the display control section 15 performs the display control in a manner similar to that of each of the fourth and fifth modes. On the other hand, in the display panel 111 on the display surface S1 side, the display control is performed to establish the partial single-color display state and the transparent state. Specifically, the display control is performed so that a vicinity of a pixel region corresponding to (facing) the display pixel region in the display panel 112 is in the single-color display state, on a principle similar to that in the fifth display mode. In addition, the display control is performed so that a non-display pixel region (a transparent pixel region or background region) vicinity in the display panel 112 is in the transparent state, on a principle similar to that in the fourth display mode. In other words, in this sixth display mode, the partial single-color display in the display panel 111 on the back side is performed by establishing association with the displayed image in the display panel 112 on the front side.

In this sixth display mode, first, as with the fourth display mode, while the display section 11 (the display surface S2) partially displays the image, the display section 11 is in the transparent state in the background part thereof, when viewed from either of the display surface S1 side and the display surface S2 side. Further, as with the fifth display mode, when the displayed image is viewed from the display surface S2 side, the displayed image is readily viewed, even in a dark environment where the outside light Le is little. Furthermore, in this display pixel region, the image display by selective superposition in both of the display panels 111 and 112 is performed and thus, an effect of improving the contrast can also be expected. Therefore, advantages and the like in both of the fourth, and fifth display modes are achievable, which makes it possible to perform necessary image display of high definition image quality, even in a dark environment, while maintaining an advanced brightness impression to a certain extent. As a result, in this sixth display mode, a further improvement of convenience to the user can be expected.

Here, such selection of one display mode from the fourth to sixth display modes is set, for example, according to the operation signal Sm obtained by the input operation performed on the operation sections 12a, 12b, and 12c, or the environmental illuminance Di detected by the illuminance sensor 14, as described above. In addition, other setting, such as setting of color (for example, white, red, green, and blue) in the single-color display state in the display panel 111 in the fifth and sixth display modes, and setting of the portion of the pixel region to be in the single-color display state or the transparent state in the sixth display mode, may also be arbitrarily adjustable (settable) according to this operation signal Sm. In such a case, these kinds of setting are arbitrarily adjustable according to preference of the user or a use environment, and therefore, a further improvement of convenience to the user can be expected.

In this way, in the electronic apparatus 1, when the display surface S2 facing upward is detected, any of the fourth to sixth display modes is arbitrarily settable according to, for example, various indexes to the described later, and therefore, a further improvement of convenience to the user can be expected.

(Adaptation Relationship between Various indexes and Each Display Mode)

Here, Part (A) to Part (D) of FIG. 18 each schematically illustrate an example of an adaptation relationship between various indexes and each display mode. It is to be noted that, each index described here is only an example, and other indexes may be utilized in selecting the display mode.

First Part (A) of FIG. 18 illustrates an example of a correspondence with each display mode, for adaptability to presence/absence of an external power supply (power saving) of the electronic apparatus 1. It is to be noted that, in this example, each of use in a house (the external power supply being present) and use in a garden or on a train (the external power supply being absent and battery driving being used) is illustrated, by being associated with the display modes assumed to be suitable.

As illustrated in this Part (A) of FIG. 18, it may be said that it is desirable to perform the image display giving priority to image quality, by utilizing the display mode (the first to third display modes) of allowing visual recognition with the display surface S1 (the display panel 111 including the light emitting element 211) facing upward, when the external power supply is present. On the other hand, when the external power supply is absent (the battery driving), it may be said, that it is desirable to perform the image display giving priority to power saving and mobility, by utilizing the display mode (the fourth to sixth display modes) of allowing visual recognition with the display surface S2 (the display panel 112 including the light control element 221) facing upward. By thus setting the display mode, the image display adapted to the presence/absence of the external power supply (power saving) can be implemented.

Further, Part (B) of FIG. 18 illustrates an example of a correspondence with each display mode, for adaptability to ambient light environment in using the electronic apparatus 1. It is to be noted that, in this example, each of use in darkness (when the environmental illuminance is low), and use in a room during the daytime or in direct sunlight (when the environmental illuminance is high) is illustrated, by being associated with the display modes assumed to be suitable.

As illustrated in this Part (B) of FIG. 18, it may be said that it is desirable to perform the image display based on self-light emission, by utilizing the display mode (the first to third display modes) of allowing visual recognition with the display surface S1 (the display panel 111 including the light emitting element 211) facing upward, when the environmental illuminance is low (in a dark light environment). On the other hand, when the environmental illuminance is high (in a bright light environment), it may be said that it is desirable to perform the reflective image display, by utilizing the display mode (the fourth to sixth display modes) of allowing visual recognition with the display surface S2 (the display panel 112 including the light control element 221) facing upward. By thus setting the display mode, the image display adapted to the ambient light environment can be implemented.

Part (C) of FIG. 18 illustrates an example of a correspondence with each display mode, for adaptability to unique design and unique expression preference (fashionability) in the electronic apparatus 1 (the display section 11). It is to be noted that, in this example, each of orthodox fashion, uniqueness emphasizing fashion, and sparkling-effect expressing fashion is illustrated, by being associated with the display modes assumed to be suitable.

As illustrated in this Part (C) of FIG. 18, it may be said that the second and fifth display modes in which the background part is in the single-color reflection display state or the single-color display suite are relatively orthodox display modes. Meanwhile, it may be said that the fourth and sixth display modes in which the reflective image display is performed and the background part is basically in the transparent state are relatively unique display modes. Further, it may be said that the first and third display modes in which the image display based on self-light emission is performed and the background part is basically in the transparent state are sparkling-effect expressing display modes. By thus setting the display mode, the image display adapted to various types of fashionability can be implemented.

Part (D) of FIG. 18 illustrates an example of a correspondence with each display made, for adaptability to the type of an image displayed in the electronic apparatus 1 (the display section 11). It is to be noted that, in this example, each of a case of an image (a still image) for picture appreciation, a case of an image (a moving image of not-so-quick movement) for a movie, and a case of a sports moving image (a moving image of fast movement) is illustrated, by being associated with the display modes assumed to be suitable.

As illustrated in this Part (D) of FIG. 18, it may be said that it is desirable to perform the image display based on self-light emission, by utilizing the display mode (the first to third display modes) of allowing visual recognition with the display surface S1 (the display panel 111 including the light emitting element 211) facing upward, in the case of the moving image. On the other hand, in the case of the still image, it may be said that it is desirable to perform the reflective image display, by utilizing the display mode (the fourth to sixth display modes) of allowing visual recognition, with the display surface S2 (the display panel 112 including the light control element 221) facing upward. By thus setting the display mode, the image display adapted to the type of the displayed image can be implemented.

(D. Specific Example of Display Control)

Next, a specific example (an example of a series of steps in the display control performed after the power supply of the electronic apparatus 1 enters an ON state and before the power supply enters an OFF state) of the display control in the electronic apparatus 1 (the display device) will be described with reference to FIG. 19 to FIG. 24.

FIG. 19 to FIG. 24 illustrate an example of this series of steps in the display control by the display control section 15 (mainly the control section 150), in a flowchart.

When the power supply of the electronic apparatus 1 enters the on (ON) state, first, the display control section 15 acquires the gravity position signal Sg from the gravity position sensor 13 (step S101 of FIG. 19). Next, based on this gravity position signal Sg, the display control section 15 determines whether the display surface S1 is in the state of facing upward (step S102). Here, when the display surface S1 is determined not to be in the state of facing upward (the other surface is in the state of facing upward) (step S102: N), the flow proceeds to step S114 (FIG. 21) to be described later.

On the other hand, when the display surface S1 is determined to be in the state of facing upward (step S112: Y), the display control section 15 performs the display control of the display panel 111 so that the image display on the display panel 111 (the display surface S1) side begins (step S103). Next, the display control section 15 performs the display control so that the image display on this display panel 111 side is fixed (step S104). The display control section 15 then performs the display control of the display panel 111 so that information display (e.g., the information indicating "power consumption increasing" or "high definition image quality mode starting", as described above) on this display surface S1 begins (step S105).

Next, the display control section 15 performs the display control of the display panel 111 so that the information display on this display surface S1 ends (step S106 in FIG. 20). It is to be noted that, a period of this information display is, for example, on the order of a few seconds. Next, the display control section 15 acquires the operation signal Sm from the operation sections 12a, 12b, and 12c (step S107). The display control section 15 then determines, based on this operation signal Sm, whether an instruction, for ending the image display is provided by the user (step S108). Here, when an instruction for ending the image display is determined to be provided (step S108: Y), the How proceeds to step S109 and step S110 (FIG. 24) corresponding to ending processing.

In this ending processing, the display control section 15 performs the display control of the display panels 111 and 112, such that the image display on the display panel 111 (the display surface S1) side ends, and the image display on the display panel 112 (the display surface S2) side also ends (step S109 and step S110 in FIG. 24). Afterward, the power supply of the electronic apparatus 1 enters the off (OFF) state, and the series of steps in the display control illustrated in FIG. 19 to FIG. 24 ends.

On the other hand, when an instruction for ending the usage display is determined not to be provided in step S108 (step S108: N), the display control section 15 then determines which one of the first to third display modes is the selected display mode, based on the operation signal Sm (step S11). It is to be noted that, here, the display surface S1 is in the state of facing upward, and therefore, one display mode among the first to third display modes is settable, as described above.

Here, when the first display mode is determined to be selected in step S111, the first display mode is already established in this state where the display control for the display panel 112 is not performed (the drive voltage Vd2 is not supplied), and therefore, the flow returns to step S101 (FIG. 19).

Alternatively, when the second display mode is determined to be selected in step S111, the display control section 15 performs the display control of the display panel 112 so that this second display mode begins. Specifically, as described above, the image display is caused to begin on this display panel 112 side so that the entire pixel region is in the single-color reflection display state in the display panel 112 (step S112). The second display mode thus begins, and then the flow returns to step S101 (FIG. 19).

Alternatively, when the third display mode is determined to be selected in step S111, the display control section 15 performs the display control of the display panel 112 so that this third display mode begins. Specifically, as described above, the image display is caused to begin on this display panel 112 side so that the partial single-color reflection display and the transparent state are established in the display panel 112 (step S113). The third display mode thus begins, and then the flow returns to step S101 (FIG. 19).

Here, when the display surface S1 is determined not to be in the state of facing upward in step S102 (step S102: N), the display control section 15 then performs the following determination, based on the operation signal Sm. That is, it is determined whether the display surface S2 is in the state of facing upward (step S114 in FIG. 21).

Here, when the display surface S2 is determined not to be in the state of facing upward (a surface other than the display surfaces S1 and S2 is in the state of facing upward) (step S114: N), the display control section 15 then acquires the operation signal Sm again from the operation sections 12a, 12b, and 12c (step S115). Next, based on this operation signal Sm, the display control section 15 determines whether an instruction for executing the image display on both of the display surfaces S1 and S2 (bidirectional display, or double-sided display) is provided by the user (step S116). Here, when an instruction, for executing the bidirectional display is determined not to be provided (step S116: N), the flow returns to the first step S101 (FIG. 19).

On the other hand, when an instruction for executing the bidirectional display is determined to be provided (step S116: Y), the display control section 15 performs the display control of the display panels 111 and 112 so that this bidirectional display begins. Specifically, first, the display control section 15 performs the display control of the display panel 111 so that fixing of the image display on the display panel 111 (the display surface S1) side is canceled (step S117). Next, the display control section 15 performs the display control of the display panels 111 and 112, such that the image display on the display panel 111 side begins, and the image display on the display panel 112 (the display surface S2) side also begins (step S118 and step S119). The bidirectional display thus begins, and then the flow returns to step S101 (FIG. 19).

Here, when the display surface S2 is determined to be is the state of facing upward in step S114 (step S114: Y), the display control section 15 performs the display control of the display panel 112 so that the image display on the display panel 112 (the display surface S2) side begins (step S120). Next, the display control section 15 performs the display control so that the image display on this display panel 112 side is fixed (step S121). Next, the display control section 15 performs the display control of the display panel 112 so that information display (e.g., the information indicating "power consumption decreasing" or "carry mode starting" as described above) on this display surface S2 begins (step S122).

Next, the display control section 15 performs the display control of the display panel 112 so that the information display on this display surface S2 ends (step S123 in FIG. 22). It is to be noted that, a period of this information, display is also, for example, on the order of a few seconds. Next the display control section 15 acquires the operation signal Sm from the operation sections 12a, 12b, and 12c (step S124). The display control section 15 then determines, based on this operation signal Sm, whether an instruction for ending the image display is provided by the user (step S325). Here, when an instruction for ending the image display is determined to be provided (step S125: Y), the How proceeds to the ending processing (step S109 and step S110 in FIG. 24) described above.

On the other hand, when an instruction for ending the image display is determined not to be provided (step S123: N), the display control section 15 then, determines whether the fourth display mode is selected, based on the operation signal Sm (step S126). It is to be noted that, here, the display surface S2 is in the state of facing upward, and therefore, one display mode among the fourth to sixth display modes is sellable, as described above.

Here, when the fourth display mode is determined to be selected, the fourth display mode is already established in this state where the display control for the display panel 111 is not performed (the drive voltage Vd1 is not supplied), and therefore, the flow returns to step S101 (FIG. 19).

On the other hand, when the fourth display mode is determined not to be selected, the display control section 15 then acquires the environmental illuminance Di detected in the illuminance sensor 14 (step S127). The display control, section 15 then determines whether this environmental illuminance Di is less than a predetermined, threshold Dth (Di<Dth) (step S128 in FIG. 23). It is to be noted that, this threshold Dth is, for example, an environmental illuminance set as a criterion for determining whether reading in outside light is possible. However, this threshold Dth is not limited to a fixed value, and may be a variable value that is changeable to an arbitrary value depending on the situation. Here, when the environmental illuminance Di is determined to be the threshold Dth or greater (Di≥Dth) (step S128: N), the environmental illuminance is relatively high (a relatively bright light environment), and therefore, the fourth display mode is automatically selected (set) for the reason described above. Therefore, afterward, as described above, since the fourth display mode is already established in this state, the (low returns to step S101 (FIG. 19).

On the other hand, when the environmental illuminance Di is determined to be less than the threshold Dth (Di<Dth) (step S128: Y), the environmental illuminance is relatively low (a relatively dark light environment), and therefore, the fifth or sixth display mode is automatically selected for the reason described above. In this case, the display control section 15 next performs the display control of this display panel 112 so that color tone correction in the image display on the display panel 112 (the display surface S2) side is performed (step S129). The display control section 15 then performs the display control of this display panel 111, such that the image display on the display panel 111 (the display surface S1) side begins, as a precondition for starting the display mode in the fifth or sixth display mode (step S130).

Next, based on the operation signal Sm acquired in step S124, the display control section 15 determines whether the fifth display mode is selected (step S131). Here, when the fifth display mode is determined to be selected (step S131: Y), the display control section 15 performs the display control of the display panel 111 so that tins fifth display mode begins. Specifically, as described above, the image display on this display panel 111 side is changed so that the entire pixel region is in the single-color display state in the display panel 111 (step S132). The fifth display mode thus begins, and then the flow returns to step S101 (FIG. 19).

On the other hand, when the sixth display mode is determined to be selected (step S131: N), the display control section 15 performs the display control of the display panel 111 so that this sixth display mode begins. Specifically, the image display on this display panel 111 side is changed so that the partial single-color display state and the transparent state are established in the display panel 111 as described above (step S133). The sixth display mode thus begins, and then the flow returns to step S101 (FIG. 19). This ends the description of the series of steps in the display control illustrated, in FIG. 19 to FIG. 24.

As described above, in the present embodiment, the two types of the display panels 111 and 112 are provided in the display section 11, and therefore, it possible to implement the image display on the display surfaces S1 and S2 facing each other, by allowing the device functions in the respective display panels 111 and 112 to complement each other. Therefore, an improvement in the convenience of the user can be achieved.

In addition, since such image display (the double-sided display) on the display surfaces S1 and S2 is enabled, it is possible to enlarge a display area in the display section 11 (the electronic apparatus 1) to a large extent. Accordingly, it is possible to display information with many added value, so that a further improvement in the convenience of the user can be achieved.

Moreover, for example, when the display panel 111 and the display panel 112 display the respective different images overlapping each other, it is possible to display information with more added values, so that a further improvement in the convenience of the user can be achieved.

2. Modifications

Next, modifications (Modification 1 and Modification 2) of the above-described embodiment will be described. It is to be noted that, the same components as those in the above-described embodiment will be provided with the same reference numerals as those of the embodiment, and the description thereof will be omitted as appropriate.

Modification 1

(Configuration)

FIG. 25 schematically illustrates a configuration example of an electronic apparatus (an electronic apparatus 1A) with a display device according to Modification 1, in a plan view (an X-Y plan view). In the electronic apparatus 1A (the display device) of the present modification, the display section 11 is configured to be foldable in two (two display regions) (see an arrow P3 in FIG. 25). Specifically, this display section 11 is configured to include a display section 11a (a first display section), a display section 11b (a second display section), and a hinge section 110.

As with the display section 11 described in the embodiment, the display section 11a has such a configuration that the display panel 111 disposed on the display surface S1 side and the display panel 112 disposed on the display surface S2 side are overlaid with each other in a thickness direction (a Z-axis direction). Similarly, the display section 11b also has such a configuration that the display panel 111 disposed on the display surface S1 side and the display panel 112 disposed on the display surface S2 side are overlaid with each other in a thickness direction. It is to be noted that, in this example, in either of the display sections 11a and 11b, the display panels 111 and 112 are disposed so that the display surface S1 faces inward whereas the display surface S2 faces outward, in a state where the entire display section 11 is folded (a closed state).

The hinge section 110 is a part provided to connect the two display sections 11a and 11b in a foldable manner (free open-close). In this example, the hinge section 110 is disposed to extend in a Y-axis so that a rotation shaft in folding (opening and closing) corresponds to the Y-axis.

(Action and Effect)

In the electronic apparatus 1A having such a configuration, a similar effect by a similar action to those of the electronic apparatus 1 of the embodiment can be basically obtained.

In addition, in this electronic apparatus 1A, in particular, since the display section 11 is foldable in two, various display manners to be described below can be implemented depending on, for example, the use situation, so that a further improvement in the convenience of the user can be achieved.

Specifically, for example, as illustrated in FIG. 26A, when a state where the display sections 11a and 11b are folded and closed is detected, the display control section 15 performs, for example, the following display control. That is, the display control section 15 performs the above-described display control so that the entire pixel region in each of these display sections 11a and 11b is in the transparent state in each of the display panels 111 and 112.

It is to be noted that, whether the display sections 11a and 11b are in the state of being folded (whether the closed state or an opened state) is detected, for example, based on a mechanism state in the hinge section 110, and, for example, a detection signal indicating the states thereof is supplied to the display control section 15.

In this example illustrated in FIG. 26A, the display sections 11a and 11b are both in the transparent state (the light transmission state). Therefore, for example, in a state such as the standby state of the electronic apparatus 1A (the display device), the entire display section 11 is a panel that is transparent when viewed from either of the front and the back, so that a display design with an advanced brightness impression can be implemented. In addition, in this case, the four display panels (two for the display panel 112, and two for the display panel 111) are overlaid with each other as a whole in the display section 11, and therefore, the following effect can also be expected by setting, for example, any one of the first, third, fourth, and sixth display modes, in each of the display sections 11a and 11b. In other words, it is possible to display information with more added values, by displaying three or four types of different images overlapping each other. Moreover, it is possible to achieve a further improvement in the convenience of the user, by displaying the same three or four images overlaid with each other.

Further, for example, as illustrated in FIG. 26B, when a state where the display sections 11a and 11b are opened in an up-down direction (a vertical direction, or a Y-axis direction in this example) with the hinge section 110 interposed therebetween is detected, the display control section 15 performs, for example, the following display control. That is, the display control section 15 performs the above-described display control so that the image display by the transparent state in the display surface S1 or the display surface S2 (the display surface S1 in this example) is performed in one of the display sections 11a and 11b (the display section 11a in this example). Specifically, the display control of the display panels 111 and 112 in the display section 11a is performed so that, for example, the image display by any one of the first, and third, fourth, and sixth display modes (the first or third display mode m this example) is performed. In addition, the display control section 15 performs the above-described display control on the other one (the display section 11b in this example) so that the image display by the non-transparent state is performed on the display surface S1 or the display surface S2 (the display surface S1 in this example). Specifically, the display control of the display panels 111 and 112 in the display section 11b is performed so that, for example, the image display by the second or fifth display mode (the second display mode in this example) is performed.

In this example illustrated in FIG. 26B, the image display by the transparent state is performed in the display section 11a, and the image display by the non-transparent state is performed in the display section 11b, and therefore, for example, various use manners such as one to be described below are implemented, so that a further improvement in the convenience of the user can be achieved. Specifically, for example, when a small camera image sensor (e.g., an image pickup device such as a CMOS (Complementary Metal-Oxide-Semiconductor)) is disposed on the display surface S2 side in the display section 11a or the display section 11b, the following use manner can be implemented. That is, for example, it is possible to implement a use manner, which displays screens for various applications in the display section 11b, while utilizing the display section 11a as an electronic viewfinder (with a high-definition large screen) in image pickup.

On the other hand, for example, as illustrated in FIG. 26C, when a state where the display sections 11a and 11b are opened in a lateral direction (a horizontal direction, an X-axis direction in this example) with the hinge section 110 interposed therebetween is detected, the display control section 15 performs, for example, the following display control. That is, the display control section 15 performs the above-described display control so that the image display by the non-transparent state is performed on a common display surface (the display surface S1 in this example), which is one of the display surface S1 and the display surface S2, in each of these display sections 11a and 11b. Specifically, the display control of the display panels 111 and 112 in each of the display sections 11b and 11b is performed so that, for example, the image display by the second or fifth display mode (the second display mode in this example) is performed.

In this example illustrated in FIG. 26C, the image display by the non-transparent state is performed on the common display surface (the display surface S1) in each of the display sections 11a and 11b, and therefore, for example, various use manners such as one to be described below are implemented, so that a further improvement in the convenience of the user can be achieved. Specifically, for example, by using the first to sixth display modes, while performing the single image display (large-screen display achieved by combining the two display surfaces S1) on the entire common display surface in these display sections 11a and 11b, a further improvement in the convenience of the user can be achieved.

Modification 2

FIG. 27A and FIG. 27B each schematically illustrate a configuration example of an electronic apparatus (an electronic apparatus 1B) with a display device according to Modification 2, in a perspective view. In the electronic apparatus 1B (the display device) of the present modification, components such as the display panels 111 and 112 in the display section 11 have flexibility and are configured as a thin flexible display. Further, in this example, the entire electronic apparatus 1B including the housing 10 exhibits flexibility.

Therefore, storing and carrying this electronic apparatus 1B in a state of being folded (in a state such as the standby state) when not in use are implemented, for example, as illustrated in FIG. 27A (see an arrow P4 in FIG. 27A). In addition, when, for example, each of the display panels 111 and 112 in the display section 11 is set in the transparent state (the light transmission state) as described above, a see-through folding state can be implemented in such a time when not in use, for example, as illustrated in FIG. 27A.

On the other hand, using this electronic apparatus 1B according to an arbitrary curve degree (a deflection state, or a bending state) including a flat state is implemented when in use (in the image display), for example, as illustrated in FIG. 27B. In addition, in this case as well, the image display can be performed by arbitrarily setting one display mode among the plurality of types of display modes (the first to sixth display modes) described above.

Here, in this electronic apparatus 1B, each of the display panels 111 and 112 in the display section 11 has a configuration using a flexible substrate such as a resin film, in place of the glass substrate. Further, each device such as the drive device is configured using a flexible device such as an organic TFT. The housing 10 is an outer member having flexibility as well. Specifically, this housing 10 is made of a material such as a resin film (a transparent film), which is soft and has transparency (optical transparency) for display light exemplified by an olefin resin.

In the electronic apparatus 1B having such a configuration, a similar effect by a similar action to those of the electronic apparatus 1 of the embodiment can be basically obtained.

In addition, in particular, in this electronic apparatus 1B, since each component such as the display panels 111 and 112 has flexibility, for example, the above-described various use manners and display manners can be implemented, so that a further improvement in the convenience of the user can be achieved.

3. Other Modifications

Technology of the present disclosure is described above using the embodiment and modifications, but the present technology is not limited to these embodiments and the like, and may be variously modified.

For example, the embodiment and the like are described using, as an example, the case where one of the three types of display modes (the first to third display modes, or the fourth to sixth display modes) is selected, but are not limited thereto. In other words, one display mode may be selected, from arbitrary two types of display modes among these three types of display modes. In addition, the way of selecting the display mode in these cases is not limited to the ways described in the embodiment and the like, and one of the plurality of types of display modes may be selected (changed) using other way.

Moreover, the plurality of types of display modes also are not limited to the six types of display modes (the first to sixth display modes) described in the embodiment and the like, and other type of display mode may be added (or alternatively provided) and used.

Further, the embodiment and the like are described using the specific type, configuration, and the like of each of the light emitting element and the light control element each serving as the display element in each of the display panels, but are not limited thereto. For example, a light emitting element other than the organic EL device and a light control element other than the liquid crystal device, using the cholesteric liquid crystal may each be used as the display element. In addition, the light emitting element may perform color image display, by using, for example, a light emitting element emitting white light and a three-primary color filter (disposed both above and below the light emitting element in this case), instead of performing the emission of each color in the three primary colors (R, G, B). Moreover, in some cases, the image display in each display panel may be monochrome image display, not the color image display described in the embodiment and the like.

In addition, the Modification 1 is described above using, as an example, the case where the display section is foldable in two (the display section includes the foldable two display sections), but is not limited thereto. In other words, for example, the display section may be foldable in three or more (the display section may include three or more foldable display sections).

Further, the embodiment and the like are described using the specific configurations of the electronic apparatus and the display device, but are not limited to those configurations. Specifically, for example, these configurations may be partially replaced with other configuration, or other configuration may be further added. In addition, any shape, layout, quantity, material, and the like in each configuration are also not limited to those described in the embodiment and the like, and other shape, layout, quantity, material, and the like may be adopted.

Furthermore, the various examples described above may be arbitrarily combined and appropriately used.

In addition, the display device of the present disclosure may be applied not only to the mobile apparatus descried as an example of the electronic apparatus in the embodiment and the like, but also to other various mobile apparatuses (e.g., an electronic book, a notebook PC (Personal computer), a mobile audio layer, a mobile movie player, a mobile phone, a wearable terminal, and the like). Moreover, the display device of the present disclosure may be applied not only to such a mobile apparatus but also to various electronic apparatuses (e.g., a TV apparatus (a TV receiver), an illumination apparatus, a display device built in a window, a mirror, or the like, an electronic sign (Digital Signage), a car navigation system, and the like).

It is to be noted that, the effects described in the present, specification are only examples and not limitative, and there may be other effects.

It is to be noted that the present technology may also have the following configurations.

(1) A display device, including:
display section having a first display surface and a second display surface facing each other,
wherein the display section includes
a first display panel disposed on the first display surface side, and including a plurality of light emitting elements, and
a second display panel disposed on the second display surface side, and including a plurality of light control elements each performing light control for control of transmission or reflection of incident light perforating reflective image display utilizing reflection of the incident light.

(2) The display device according to (1), wherein
the light emitting element outputs emission light toward both of the first and second display surface sides, and
the light control element performs the light control and the reflective image display, for both of the incident light from the first display surface side and the incident light from the second display surface side.

(3) The display device according to (2), wherein in each of the first and second display panels, optical transparency changes on a pixel-by-pixel basis, according to a drive voltage applied to the light emitting element or the light control element.

(4) The display device according to (3), further including a display control section configured to perform individual control of image display in the first and second display panels,
wherein the display control section performs the individual control to execute one display mode selected from a plurality of types of display modes utilizing a change in the optical transparency on the pixel-by-pixel basis.

(5) The display device according to (4), wherein
when image display by the light emitting element is performed, in at least a portion of the pixel region of the first display panel,
the display control section performs the individual control to execute one display mode selected from at least two or more types of display modes among three types of display modes serving as the plurality of types of display modes, the modes comprising:
a first display mode in which an entire pixel region of the second display panel is in a transparent state, by utilizing the transmission of the incident light by the light control element,
a second display mode in which the entire pixel region of the second display panel is in a single-color reflection display state, by utilizing the reflective image display based on the incident light from the first display surface side by the light control element, and
a third display mode in which, in the second display panel, a vicinity of a pixel region corresponding to a display pixel region in the first display panel is in the single-color reflection display state, and a vicinity of a pixel region corresponding to a transparent pixel region that is a non-display pixel region in the first display panel is in the transparent state.
(6) The display device according to (5), wherein
setting of color in the single-color reflection display state in the second and third display modes, and
setting of a portion of a pixel region to be in the single-color reflection display state or the transparent state in the third display mode
are each arbitrarily adjustable,
(7) The display device according to (5) or (6), wherein front the at least two or more types of display modes among the first to third display modes, the one display mode is selected according to an operation signal input from outside.
(8) The display device according to any one of (5) to (7), wherein when a state where the first display surface faces upward is detected,
the display control section performs the individual control to perform the image display in at least a portion of the pixel region of the first display panel.
(9) The display device according to any one of (4) to (8), wherein
when the reflective image display based on the incident light from the second display surface side by the light control element is performed, in at least a portion of the pixel region of the second display panel,
the display control section performs the individual control to execute one display mode selected from at least two or more types of display modes among three types of display modes serving as the plurality of types of display modes, the modes comprising:
a fourth display mode in which an entire pixel region of the first display panel is in a transparent state by the light emitting element entering a non-emission state,
a fifth display mode in which the entire pixel region of the first display panel is in a single-color display state by the light emitting element entering an emission state, and
a sixth display mode in which, in the first display panel, a vicinity of a pixel region corresponding to a display pixel region in the second display panel is in the single-color display state, and a vicinity of a pixel region corresponding to a transparent pixel region that is a non-display pixel region in the second display panel is in the transparent state.

(10) The display device according to (9), wherein
setting of color in the single-color display state in the fifth and sixth display modes, and
setting of a portion of a pixel region to be in the single-color display state or the transparent state in the sixth display mode
are each arbitrarily adjustable.
(11) The display device according to (9) or (10), wherein from the at least two or more types of display modes among the fourth to sixth display modes, the one display mode is selected according to an operation signal input from outside or a defected environmental illuminance.
(12) The display device according to (11), wherein
the fourth display mode is selected as the one display mode, when the environmental illuminance is equal to or greater than a threshold, and
the fifth or sixth display mode is selected as the one display mode, when the environmental illuminance is less than the threshold.
(13) The display device according to any one of (9) to (12), wherein
when the second display surface being in a state of facing upward is detected, the display control section performs the individual control to perform the reflective image display in at least a portion of the pixel region of the second display panel.
(14) The display device according to any one of (4) to (13), wherein
when the display device being in a standby stale is detected,
the display control section performs the individual control to allow a pixel region, in each of the first and second display panels to be in a transparent state.
(15) The display device according to any one of (1) to (14), wherein
the display section includes
a first display section and a second display section each having the first and second display panels, and
a hinge section configured to connect the first and second display sections in a foldable manner.
(16) The display device according to (15), wherein
when the first and second display sections being in a folded and closed state is detected,
in each of the first and second display sections, display control is performed to allow a pixel region in each of the first and second display panels to be in a transparent state.
(17) The display device according to (15) or (16), wherein
when a state where the first and second display sections axe opened in an up-down direction with the hinge section interposed therebetween is detected,
display control is performed to perform image display by a transparent state in the first or second display surface, in one of the first and second display sections, and to perform image display by a non-transparent state in the first or second display surface, in the other one, and
when a state where the first and second display sections are opened in a lateral direction with the hinge section interposed therebetween is detected,
display control is performed to perform image display by a non-transparent state in a common display surface that is one of the first and second display surfaces, in each of the first and second display sections.
(18) The display device according to any one of (1) to (17), wherein the first and second display panels each have flexibility.
(19) The display device according to any one of (1) to (18), wherein the light emitting element is an organic electroluminescence element, and the light control element comprises cholesteric liquid crystal.

(20) An electronic apparatus, including:
a display device,
wherein the display device includes
a display section having a first display surface and a second display surface facing each other, and
the display section includes
a first display panel disposed on the first display surface side, and including a plurality of light emitting elements, and
a second display panel disposed on the second display surface side, and including a plurality of light control elements each perforating light control for control of transmission or reflection of incident light performing reflective image display utilizing the reflection of the incident light.

The present application is based on and claims priority from Japanese Patent Application No. 2013-197791 filed in the Japan Patent Office on Sep. 25, 2013, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A display device, comprising:
a display section, wherein the display section comprises a first display surface that faces a second display surface of the display section,
wherein the display section includes:
a first display panel on the first display surface, and the first display panel includes a plurality of light emitting elements, and
a second display panel on the second display surface, wherein the second display panel includes a plurality of light control elements, and
wherein a light control element of the plurality of light control elements is configured to:
control one of transmission of incident light or reflection of the incident light; and
control display of a reflective image based on the reflection of the incident light,
wherein each of the first display panel and the second display panel is configured to change optical transparency for at least one of a first pixel of the first display panel or a second pixel of the second display panel, and
wherein the optical transparency is changed based on a drive voltage which is applied to at least one of a light emitting element of the plurality of light emitting elements or the light control element.

2. The display device according to claim 1, wherein the light emitting element is configured to output emission light towards at least one of a first side of the first display surface or a second side of the second display surface, and
the light control element is further configured to control the incident light and control the display of the reflective image, for the incident light from the first side of the first display surface and the incident light from the second side of the second display surface.

3. The display device according to claim 1, further comprising a display control section configured to:

control display of a first image in the first display panel and control display of a second image in the second display panel; and
control execution of a first selected display mode selected from a plurality of types of display modes,
wherein the first selected display mode is executed based on the change in the optical-transparency.

4. The display device according to claim 3, wherein the display control section is further configured to control execution of the first selected display mode selected from at least two types of display modes among three types of display modes, wherein the three types of display modes serve as the plurality of types of display modes, and
wherein the first display mode is executed based on the display of the first image in at least a first portion of a first pixel region of the first display panel,
the three types of display modes comprising:
a first display mode in which a second pixel region of the second display panel is in a transparent state, wherein the transparent state of the second pixel region is based on the transmission of the incident light by the light control element,
a second display mode in which the second pixel region of the second display panel is in a single-color reflection display state, wherein the single-color reflection display state of the second pixel region is based on the display of the reflective image, and wherein the reflective image is displayed based on the incident light reflected from first side of the first display surface by the light control element, and
a third display mode in which:
a third pixel region of the second display panel corresponding to a display pixel region in the first display panel is in the single-color reflection display state, and
a fourth pixel region of the second display panel corresponding to a transparent pixel region in the first display panel is in the transparent state, wherein the transparent pixel region is a non-display pixel region in the first display panel.

5. The display device according to claim 4, wherein the display control section is further configured to:
adjust a setting of color in the single-color reflection display state in the second display mode and the third display mode, and
adjust the setting of a third portion of a fifth pixel region to correspond to one of the single-color reflection display state or the transparent state in the third display mode.

6. An electronic apparatus, comprising:
a display device,
wherein the display device includes
a display section, wherein the display section comprises a first display surface that faces a second display surface of the display section,
the display section includes:
a first display panel on the first display surface, and the first display panel includes a plurality of light emitting elements, and
a second display panel on the second display surface, wherein the second display panel includes a plurality of light control elements, and
wherein a light control element of the plurality of light control elements is configured to:
control one of transmission of incident light or reflection of the incident light; and control display of a reflective image based on the reflection of the incident light, and wherein each of the first display panel and the second display panel is configured to change optical transparency for at least one of a first pixel of the first display panel or a second pixel of the second display panel, and wherein the optical transparency is changed based on a drive voltage which is applied to at least one of a light emitting element of the plurality of light emitting elements or the light control element.

* * * * *